United States Patent
Takahashi

(10) Patent No.: US 10,541,367 B2
(45) Date of Patent: Jan. 21, 2020

(54) ORGANIC EL DISPLAY PANEL PRODUCTION METHOD

(71) Applicant: JOLED INC., Tokyo (JP)

(72) Inventor: Yasuyuki Takahashi, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/302,900

(22) PCT Filed: Mar. 27, 2015

(86) PCT No.: PCT/JP2015/001781
§ 371 (c)(1),
(2) Date: Oct. 7, 2016

(87) PCT Pub. No.: WO2015/155953
PCT Pub. Date: Oct. 15, 2015

(65) Prior Publication Data
US 2017/0033288 A1    Feb. 2, 2017

(30) Foreign Application Priority Data

Apr. 10, 2014 (JP) .................................. 2014-081099

(51) Int. Cl.
*H01L 51/00* (2006.01)
*B05D 1/26* (2006.01)
(Continued)

(52) U.S. Cl.
CPC ............ *H01L 51/0005* (2013.01); *B05D 1/26* (2013.01); *B05D 1/36* (2013.01); *B05D 3/0254* (2013.01); *H01L 51/56* (2013.01); *H05B 33/10* (2013.01)

(58) Field of Classification Search
CPC ... H01L 51/00; B05D 1/00; B05D 3/00; B41J 2/00; B41J 25/00; H05B 33/00
See application file for complete search history.

(56) References Cited

U.S. PATENT DOCUMENTS 4,219,822 A * 8/1980 Paranjpe .................... B41J 2/07
347/40
5,443,922 A   8/1995 Nishizaki et al.
(Continued)

FOREIGN PATENT DOCUMENTS

CN    1435318 A    8/2003
CN  102742357 A   10/2012
(Continued)

OTHER PUBLICATIONS

Jp 2006159703 Google Patents.*
(Continued)

*Primary Examiner* — David P Turocy
*Assistant Examiner* — Mohammad Mayy
(74) *Attorney, Agent, or Firm* — McDermott Will & Emery LLP

(57) ABSTRACT

A method for manufacturing an organic EL display panel, including: forming first electrodes over a substrate; defining, above the substrate, pixel formation regions lining up in a row direction and a column direction, by forming banks over the substrate; applying ink to each pixel formation region by causing a plurality of nozzles lining up in a straight line to discharge the ink to the pixel formation regions while displacing the nozzles relative to the substrate in a scanning direction; drying the ink to form functional layers in the pixel formation regions; and forming a second electrode at a position covering the pixel formation regions. In the application of ink, an angle θ between the scanning direction and the row direction is set to more than 0° and less than 90° and each nozzle applies the ink across a plurality of rows of the pixel formation regions.

6 Claims, 15 Drawing Sheets

(51) Int. Cl.
*B05D 1/36* (2006.01)
*H05B 33/10* (2006.01)
*B05D 3/02* (2006.01)
*H01L 51/56* (2006.01)

(56) References Cited

U.S. PATENT DOCUMENTS

| | | | |
|---|---|---|---|
| 2003/0137557 A1* | 7/2003 | Nakamura | B41J 2/14 347/44 |
| 2003/0184613 A1 | 10/2003 | Nakamura et al. | |
| 2005/0052120 A1 | 3/2005 | Gupta et al. | |
| 2006/0227163 A1* | 10/2006 | Kwon | B41J 2/16538 347/33 |
| 2012/0032207 A1 | 2/2012 | Nishiyama et al. | |
| 2013/0126844 A1 | 5/2013 | Nishiyama | |

FOREIGN PATENT DOCUMENTS

| | | |
|---|---|---|
| GB | 2 336 553 A | 10/1999 |
| JP | H05-163488 A | 6/1993 |
| JP | 2000-202357 A | 7/2000 |
| JP | 2004-111074 A | 4/2004 |
| JP | 2005-296854 A | 10/2005 |
| JP | 2006-159703 A | 6/2006 |
| JP | 2006159703 * | 6/2006 |
| JP | 2010-005619 A | 1/2010 |
| JP | 2010-266636 A | 11/2010 |
| WO | 2012/017491 A1 | 2/2012 |

OTHER PUBLICATIONS

Chinese Search Report issued in corresponding Chinese Patent Application No. 201580018620.0, dated Jun. 2, 2017; with partial English translation.

International Search Report and Written Opinion issued in International Patent Application No. PCT/JP2015/001781, dated Jun. 16, 2015; with English translation.

* cited by examiner

ORGANIC EL DISPLAY PANEL PRODUCTION METHOD

RELATED APPLICATIONS

This application is the U.S. National Phase under 35 U.S.C. § 371 of International Patent Application No. PCT/JP2015/001781, filed on Mar. 27, 2015, which in turn claims the benefit of Japanese Application No. 2014-081099, filed on Apr. 10, 2014, the disclosures of which Applications are incorporated by reference herein.

TECHNICAL FIELD

The present disclosure relates to a manufacturing method of an organic electroluminescence (EL) display panel, and particularly relates to a manufacturing method using a wet process.

BACKGROUND ART

In recent years, research and development are in progress of large-sized organic EL display panels using organic EL elements. In a typical organic EL display panel, a plurality of organic EL elements are arranged in a matrix along a main surface of a substrate serving as a support member, and an image is displayed on an image display face by the organic EL elements forming pixels.

In an organic EL element, one or more functional layers, including at least a light-emitting layer containing an organic compound, are sandwiched between a pair of electrodes. The functional layer may also include layers other than the light-emitting layer, such as an injection layer, a transport layer, a blocking layer, and a buffer layer. Formation methods for functional layers are broadly categorized into dry processes such as vacuum vapor deposition, and wet processes such as inkjet application. Wet processes involve use of a solution (hereinafter termed "ink") containing functional layer material (functional material), and are considered to be suitable for the enlargement of display panels in terms of formation precision and cost. Particularly, development is in progress of inkjet application, which is a method where ink in the form of fine droplets is discharged to be directly applied to pixel formation regions on a substrate.

Ink application involves discharging ink to pixel formation regions on a substrate from a plurality of nozzles lining up in a straight line, while displacing the nozzles relative to the substrate in a predetermined scanning direction along a main surface of the substrate. Typically, the scanning direction is set to be parallel to either a row direction or a column direction of a matrix made up of the pixel formation regions. In addition, a technology is disclosed of adjusting the distance between application positions corresponding to adjacent nozzles by inclining the nozzle array direction relative to the scanning direction (see, for example, Patent Document 1).

CITATION LIST

Patent Literature

[Patent Literature 1]
Japanese Patent Application Publication No. 2004-111074

SUMMARY OF INVENTION

Technical Problem

FIG. 16 is a schematic plan view diagram illustrating a scanning direction dsx and application positions A8 of a nozzle array 824. The nozzle array 824 is composed of a plurality of nozzles 824N arranged to line up in an extension direction dh. Each nozzle 824N discharges ink in the form of fine droplets. FIG. 16 also illustrates pixel formation regions P, each including sub-pixel formation regions SP(R), SP(G), and SP(B). The pixel formation regions P are arranged in a row direction d1 and a column direction d2. The nozzles 824N are moved in a scanning direction dsx parallel to the row direction d1, while each nozzle 824N is caused to discharge ink to application positions A8 in sub-pixel formation regions SP(R), sub-pixel formation regions SP(G), or sub-pixel formation regions SP(B). FIG. 16 illustrates an example where each nozzle 824N discharges ink to application positions A8 in sub-pixel formation regions SP(B).

Here, different ones of the nozzles 824N may discharge different amounts of ink droplets. This is for example due to individual ink discharge mechanisms not being completely the same and due to ink discharge mechanisms not being in the same state after chronological change. With the method of FIG. 16, this difference in discharge amounts of the nozzles 824N is reflected in the row direction d1.

In the following, a specific example is considered, where a nozzle 824NX emphasized with diagonal hatching in FIG. 16 has an extremely small (or extremely great) discharge amount compared to the rest of the nozzles 824N. Because the scanning direction dsx is parallel to the row direction d1, sub-pixel formation regions SP(B) (emphasized with diagonal hatching in FIG. 16) lining up in the row direction d1 receive ink from the nozzle 824NX. Due to this, in an organic EL display panel manufactured using this method, faulty pixels line up in the row direction d1, and thus, the organic EL display panel exhibits a linear unevenness in luminance, light-emission color, etc., along a pixel arrangement direction. For example, the faulty pixels may be pixels having extremely high (or extremely low) luminance compared to other pixels, pixels not emitting any light, or pixels emitting a color not matching the desired color.

This linear unevenness in luminance, light-emission color, etc., along a pixel arrangement direction also occurs in an organic EL display panel manufactured using the method disclosed in Patent Literature 1. FIG. 17 is a schematic plan view diagram illustrating a scanning direction dsx and application positions A9 of nozzle arrays 924. Each nozzle array 924 is composed of a plurality of nozzles 924N arrayed to line up in an extension direction dh, which is inclined relative to the scanning direction dsx. Thus, the method illustrated in FIG. 17 is similar to the method disclosed in Patent Literature 1. However, the methods illustrated in FIGS. 16 and 17 are similar in that the scanning direction dsx is parallel to the row direction d1. Thus, for example, when there is a nozzle 924NX (emphasized with diagonal hatching in FIG. 17) having an extremely small (or extremely great) discharge amount compared to the rest of the nozzles 924N, sub-pixel formation regions SP(B) (emphasized with diagonal hatching in FIG. 17) lining up in the row direction receive ink from the nozzle 924NX. Due to this, an organic EL display panel that is manufactured using this method exhibits a linear unevenness in luminance, light-emission color, etc., along a pixel arrangement direction, similar to the organic EL display panel manufactured using the method illustrated in FIG. 16.

Furthermore, such linear unevenness in luminance, light-emission color, etc., not only occurs when a nozzle having an extremely different discharge amount are present (e.g., when the nozzles 824NX and 924NX are present). That is, even when the difference among nozzles is not so great, a linear unevenness in luminance, light-emission color, etc., along a pixel arrangement direction can occur when a group of nozzles differing from the rest of the nozzles in a similar manner are gathered within a certain area (e.g., nozzles whose discharge amounts are smaller than average are located adjacent to one another). When such a group of nozzles exists, the difference between these nozzles and the rest of the nozzles accumulates and produces a linear unevenness in luminance, light-emission color, etc., along a pixel arrangement direction.

Such a linear unevenness in luminance, light-emission color, etc., along one pixel arrangement direction is problematic for being very noticeable and bringing about a decrease in display quality of an organic EL display panel. In view of the above, the present invention aims to provide an organic EL display panel manufacturing method that uses inkjet application and that reduces the risk of occurrence of a linear unevenness in luminance, light-emission color, etc., along a pixel arrangement direction, caused by a difference in discharge amounts of nozzles.

Solution to Problem

One aspect of the present invention is a method for manufacturing an organic EL display panel, the method including: preparing a substrate; forming a plurality of first electrodes over the substrate; defining, above the substrate, a plurality of pixel formation regions lining up in a row direction and a column direction to form a matrix, by forming banks over the substrate having the first electrodes formed thereon; applying ink containing functional material to each of the pixel formation regions by causing a plurality of nozzles lining up in a straight line to discharge the ink to the pixel formation regions while displacing the nozzles relative to the substrate in a scanning direction along a main surface of the substrate; drying the ink having been applied to form functional layers containing the functional material in the pixel formation regions; and forming one or more layers, at least including a second electrode, at a position covering the pixel formation regions having the functional layers formed therein, wherein in the application of ink, an angle θ between the scanning direction and the row direction is set to more than 0° and less than 90° and each of the nozzles applies the ink across a plurality of rows of the pixel formation regions.

Advantageous Effects of Invention

In the method pertaining to one aspect of the present invention, the scanning direction in which the nozzles are displaced is inclined with respect to the row direction. Thus, even if the nozzles include a nozzle having a discharge amount smaller or greater than the rest of the nozzles, pixel formation regions receiving ink from the nozzle do not line up in the row direction and instead, the nozzle applies the ink across multiple rows of the pixel formation regions. Accordingly, the method pertaining to one aspect of the present invention reduces the risk of occurrence of a linear unevenness in luminance, light-emission color, etc., along the row direction (i.e., a pixel arrangement direction), caused by a difference in discharge amounts of nozzles.

BRIEF DESCRIPTION OF DRAWINGS

FIG. 5A illustrates an anode formation process, FIG. 5B illustrates a hole injection layer formation process, and FIG. 5C illustrates a bank formation process.

FIG. 6A illustrates an ink application process, FIG. 6B illustrates a drying process, and FIG. 6C illustrates an electron transport layer formation process.

FIG. 7A illustrates a cathode formation process and FIG. 7B illustrates a sealing process.

FIG. 8 is a perspective view diagram illustrating an inkjet device 100 used for applying ink 16a.

FIG. 11 shows graphs indicating the relationship between application amount and relative luminance, for samples of the ink 16a.

FIG. 12 shows graphs indicating the relationship between application amount variance and N/TN, for samples of the ink 16a.

DESCRIPTION OF EMBODIMENTS

Overview of Aspects of Present Invention

Figure 1:
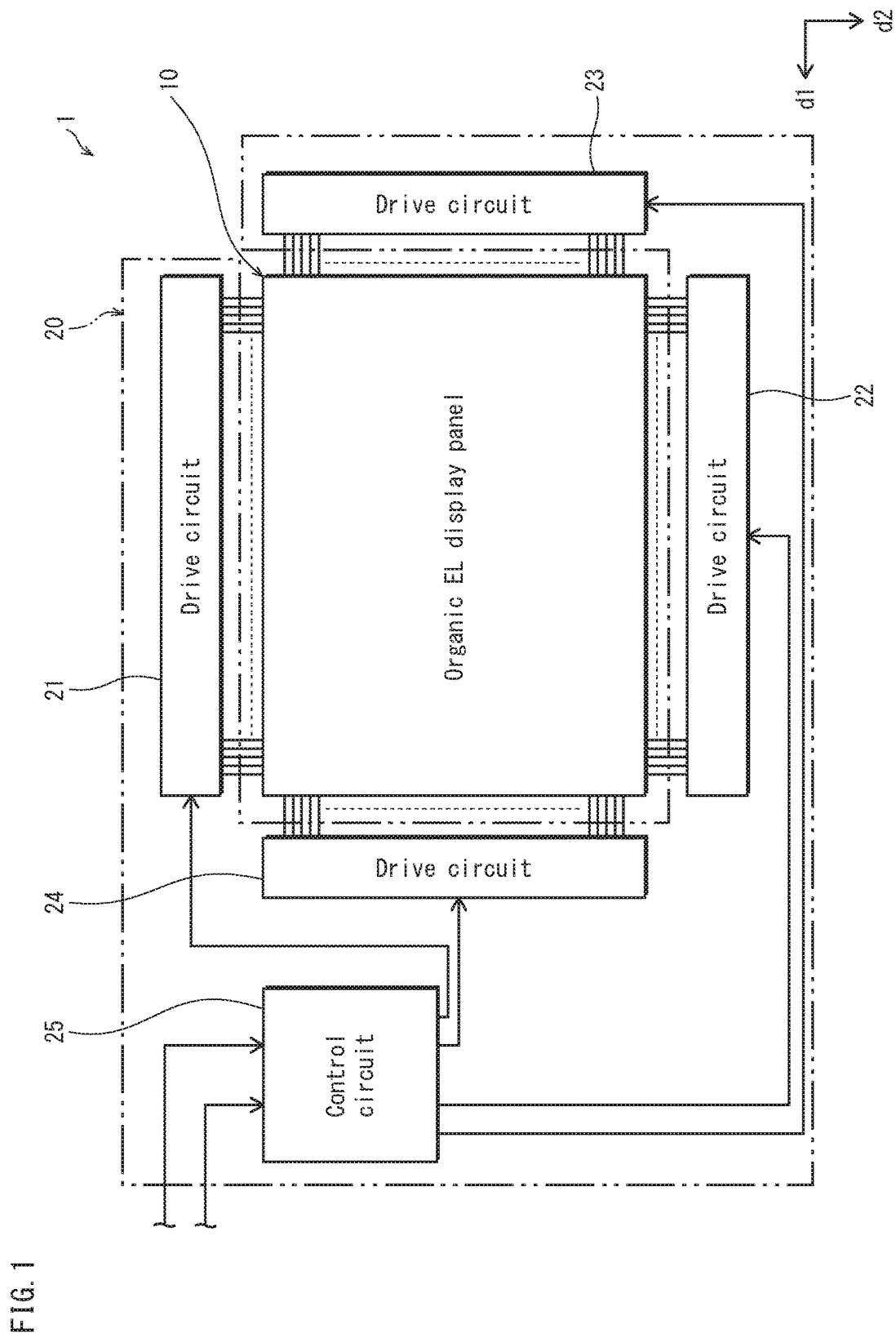
FIG. 1 is a block diagram illustrating the overall configuration of an organic EL display device 1.

One aspect of the present invention is a method for manufacturing an organic EL display panel, the method including: preparing a substrate; forming a plurality of first electrodes over the substrate; defining, above the substrate, a plurality of pixel formation regions lining up in a row direction and a column direction to form a matrix, by forming banks over the substrate having the first electrodes formed thereon; applying ink containing functional material to each of the pixel formation regions by causing a plurality of nozzles lining up in a straight line to discharge the ink to the pixel formation regions while displacing the nozzles relative to the substrate in a scanning direction along a main surface of the substrate; drying the ink having been applied to form functional layers containing the functional material in the pixel formation regions; and forming one or more layers, at least including a second electrode, at a position covering the pixel formation regions having the functional layers formed therein, wherein in the application of ink, an angle θ between the scanning direction and the row direction is set to more than 0° and less than 90° and each of the nozzles applies the ink across a plurality of rows of the pixel formation regions.

In the manufacturing method pertaining to one aspect of the present invention, the scanning direction in which the nozzles are displaced is inclined with respect to the row direction. Thus, even if the nozzles include a nozzle having a discharge amount smaller or greater than that of the rest of the nozzles, pixel formation regions receiving ink from the nozzle do not line up in the row direction and instead, the nozzle applies the ink across multiple rows of the pixel formation regions. Accordingly, the method pertaining to one aspect of the present invention reduces the risk of occurrence of a linear unevenness in luminance, light-emission color, etc., along the row direction (i.e., a pixel arrangement direction), caused by a difference in discharge amounts of nozzles.

Another aspect of the present invention is the method pertaining to one aspect of the present invention, wherein the pixel formation regions are defined to be located at a fixed pitch Dp in the row direction and at a fixed pitch Dp2 in the column direction, and in the application of ink, the angle θ is set to satisfy Dp×tan θ≠Dp2.

According to the method pertaining to this aspect, the combination of nozzles performing application changes from pixel formation region to pixel formation region. Thus, the risk is reduced of occurrence of a linear unevenness in luminance, light-emission color, etc., along the scanning direction.

Another aspect of the present invention is the method pertaining to one aspect of the present invention, wherein in the application of ink, the angle θ is set to satisfy:

$$\theta = \sin^{-1}\left(\frac{N \cdot Dn \cdot \sin \alpha}{Dp}\right) \qquad \text{[Math. 1]}$$

where Dn denotes a fixed pitch between the nozzles, α denotes an angle between the scanning direction and the straight line, and N is a positive integer.

According to the method pertaining to this, ink application positions corresponding to the nozzles are offset by exactly N times the ink application pitch, between pixel formation regions adjacent in the row direction. Accordingly, ink application positions remain the same in all pixel formation regions lining up in the row direction. Thus, the risk is low of positions in the column direction, numbers, etc., of application positions differing among pixel formation regions P lining up in the row direction. Thus, the risk is reduced of occurrence of application unevenness along the row direction. Accordingly, the method pertaining to this aspect reduces the risk of occurrence of unevenness in luminance, light-emission color, etc., in the row direction.

Another aspect of the present invention is the method pertaining to one aspect of the present invention, wherein the pixel formation regions are defined to each include sub-pixel formation regions corresponding to colors red, green, and blue, ink application with the nozzles is performed separately, by using different inks, for sub-pixel formation regions corresponding to the color red, sub-pixel formation regions corresponding to the color green, and sub-pixel formation regions corresponding to the color blue, and the positive integer N for angle θ defining the scanning direction in application of one of the inks with which luminance is most dependent upon application amount is no smaller than the positive integer N for angle θ defining the scanning direction in application of each of the other ones of the inks.

According to the method pertaining to this aspect, N denoting the number of nozzles performing application that are replaced is greatest in the application of an ink for which the influence of the difference in discharge amounts of nozzles with respect to luminance is relatively great. Accordingly, the method pertaining to this aspect effectively reduces the risk of occurrence of a linear unevenness in luminance, light-emission color, etc.

Another aspect of the present invention is the method pertaining to one aspect of the present invention, wherein the sub-pixel formation regions are each elongated in a direction orthogonal to the row direction, and in the application of any of the inks, the angle θ defining the scanning direction is set to more than 0° and less than 45°.

According to the method pertaining to this aspect, the scanning direction of the nozzles is relatively close to the row direction, which is orthogonal to the major axis direction of the sub-pixel formation regions. Accordingly, the method pertaining to this aspect increases the number of nozzles used for application per sub-pixel formation region, and thus, relatively reduces the influence of the difference in discharge amounts of the nozzles.

Another aspect of the present invention is the method pertaining to one aspect of the present invention, wherein in the application of any of the inks, the angle θ defining the scanning direction is set to satisfy:

$$\theta \le \tan^{-1}\left(\frac{Lsp}{Dp}\right) \qquad \text{[Math. 2]}$$

where Lsp denotes the length of the sub-pixel formation regions in the direction orthogonal to the row direction.

In the method pertaining to this aspect, the angle θ is set to a relatively large angle, and thus, the risk is reduced of problems occurring such as an increase in the number of nozzles required to perform application with respect to all of the sub-pixel formation regions, and the influence of the difference in discharge amounts of the nozzles appearing in the column direction.

Another aspect of the present invention is the method pertaining to one aspect of the present invention, wherein in the application of any of the inks, the angles θ and α defining the scanning direction are set to satisfy:

$$\alpha \le 90° - \theta \qquad \text{[Math. 3]}$$

The method pertaining to this aspect ensures that the number of nozzles used for application per sub-pixel formation region is at least equal to the same in typical inkjet application, and thus, reduces the risk of occurrence of a linear discrepancy in luminance, light-emission color, etc., without increasing unevenness in luminance among pixels.

Another aspect of the present invention is the method pertaining to one aspect of the present invention, wherein the main surface of the substrate has a rectangular shape, the pixel formation regions are defined so that the row direction matches a direction in which long sides of the substrate extend and the column direction matches a direction in which short sides of the substrate extend, and in the application of any of the inks, the angle θ defining the scanning direction is set to satisfy:

$$\left[ \frac{H\cos\theta + W\sin\theta}{L\sin\alpha} \right] = \left[ \frac{H}{L\sin\alpha} \right] \qquad \text{[Math. 4]}$$

where W denotes a length of the long sides of the substrate, H denotes a length of the short sides of the substrate, and L denotes a length of the array of the nozzles.

The method pertaining to this aspect achieves applying ink to the entire surface of the substrate without increasing the number of scans that need to be performed from that in typical inkjet application. Thus, the method pertaining to this aspect prevents an increase in manufacturing procedures.

Note that in the present disclosure, an angle between two intersecting directions is to be construed as the smaller one among the angles formed by the two directions when projected onto a plane defined by the two directions. Accordingly, an angle between two directions is no less than 0° and no more than 90°.

Embodiment

The following describes an organic EL display panel manufacturing method pertaining to one aspect of the present invention, with reference to the accompanying drawings.

1. Overall Configuration of Organic EL Display Device 1

FIG. 1 is a block diagram illustrating the overall configuration of an organic EL display device 1. The organic EL display device 1 is used in a device such as television, a personal computer, an industrial display, or a portable terminal, and includes an organic EL display panel 10 having a rectangular shape and a drive control unit 20 connected to the organic EL display panel 10. The drive control unit 20 includes four drive circuits, namely drive circuits 21, 22, 23, 24, and a control circuit 25.

The organic EL display panel 10 (referred to in the following as a panel 10) has a rectangular image display face. For example, the display panel 10 is a top-emission-type organic EL display panel using the active matrix scheme in the embodiment. In FIG. 1, four drive circuits, namely drive circuits 21, 22, 23, 24 are arranged surrounding the panel 10. However, the drive control unit 20 need not have the configuration illustrated in FIG. 1, and the quantity, the positions, etc., of the drive circuits may be changed as appropriate.

2. Configuration of Panel 10

Figure 2:
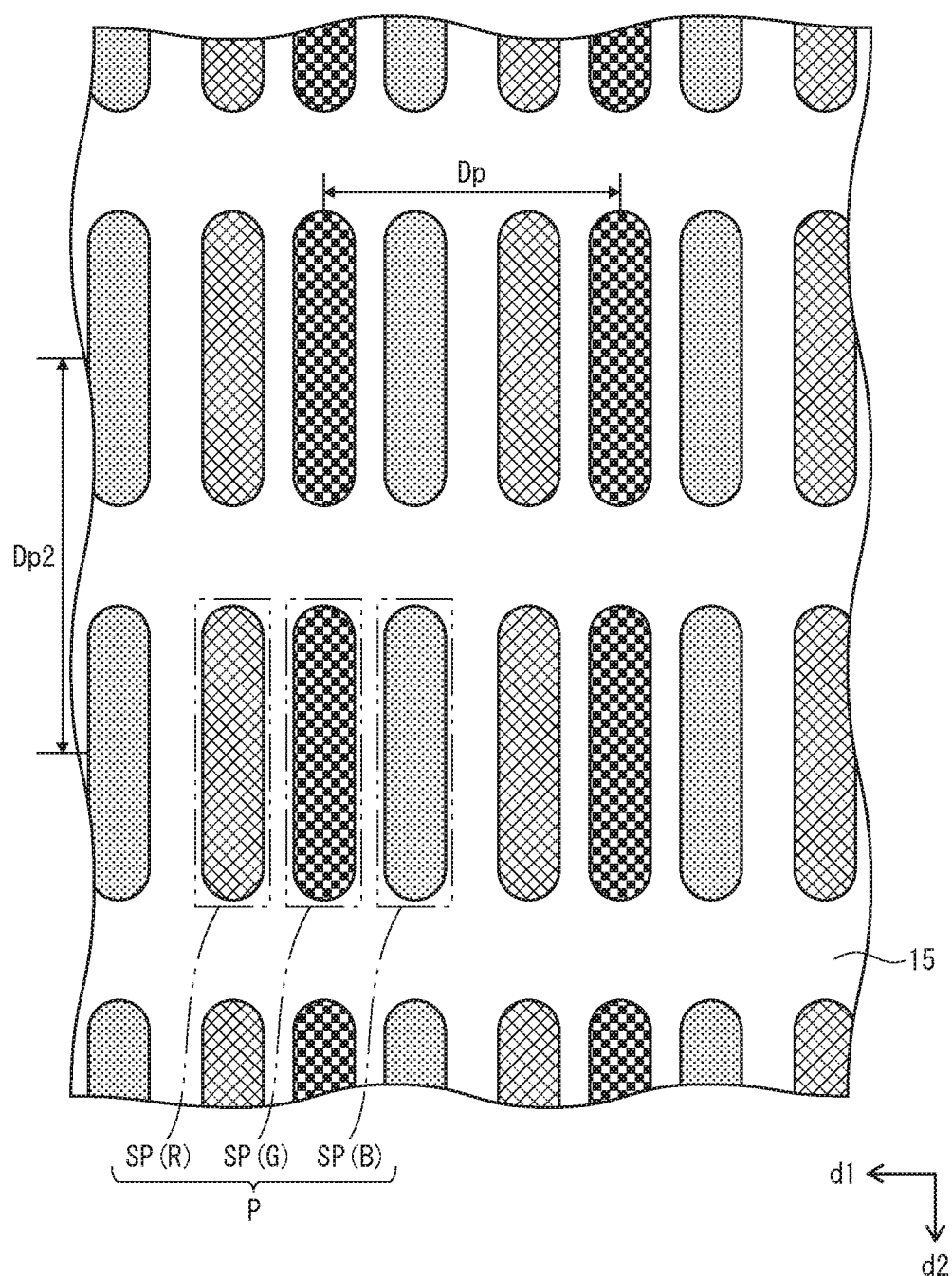
FIG. 2 is a schematic plan view of a magnified portion of an image display face of the organic EL display panel 10.

FIG. 2 is a schematic plan view of a magnified portion of the image display face of the panel 10. The panel 10 has a plurality of pixel formation regions P. The pixel formation regions P are arranged in a matrix, defined by row direction d1 and column direction d2 that are orthogonal directions along the image display face. In row direction d1, pixel formation regions P line up at a fixed pitch Dp, and in column direction d2, pixel formation regions line up at a fixed pitch Dp2.

Each pixel formation region P is a set of one sub-pixel formation region SP(R), one sub-pixel formation region SP(G), and one sub-pixel formation region SP(G) that are arranged in row direction d1 while being spaced away from one another in row direction d1. The sub-pixel formation region SP(R), the sub-pixel formation region SP(G), and the sub-pixel formation region SP(G) respectively correspond to the colors red (R), green (G), and blue (B). In the following, wherever it is unnecessary to distinguish the sub-pixel formation regions of the different colors (i.e., the sub-pixel formation regions SP(R), SP(G), SP(G)) from one another, the sub-pixel formation regions are referred to as sub-pixel formation regions SP.

As illustrated in FIG. 1, row direction d1 is parallel to a direction in which long sides of the panel 10 extend (referred to in the following as a long-side direction), and row direction d2 is parallel to a direction in which short sides of the panel 10 extend (referred to in the following as a short-side direction). In the present disclosure, a short-side direction of a rectangle or a rectangular-shaped object refers to a direction orthogonal to a long-side direction of the same.

Figure 3:
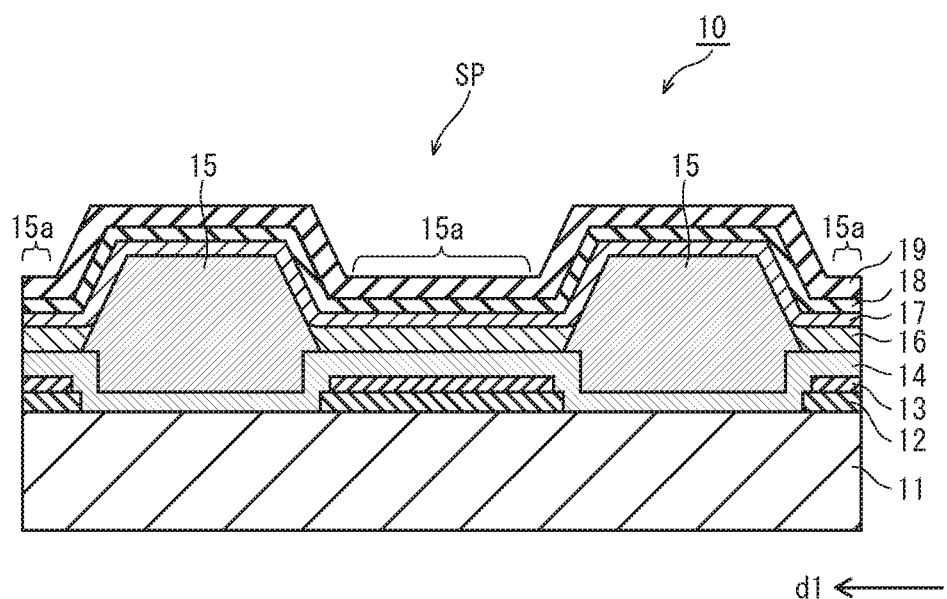
FIG. 3 is a schematic cross-sectional diagram of a sub-pixel formation region SP, taken along row direction d1.

FIG. 3 is a schematic cross-sectional diagram of one sub-pixel formation region SP, taken along row direction d1. A top-emission-type organic EL element is disposed at the sub-pixel formation region SP. The organic EL element includes a substrate 11 and layers stacked over the substrate 11, which include a first electrode 12, a light-transmissive electrode 13, a hole injection layer 14, banks 15, a light-emitting layer 16, an electron transport layer 17, a second electrode 18, and a sealing layer 19. This list of layers stacked over the substrate 11 is a mere example, and one or more other layers, such as a hole transport layer, an electron injection layer, a blocking layer, and/or a buffer layer, may also be stacked over the substrate 11. Also, one or more of the layers in the list above may not be included.

When the panel 10 is seen as a whole, a plurality of first electrodes 12 are arranged in the row direction d1 and the column direction d2 to form a matrix, and one light-transmissive electrode 13 is disposed on each of the first electrodes 12. Further, one hole injection layer 14 is disposed to cover the top surface of the substrate 11 and all of the light-transmissive electrodes 13. The hole injection layer 14 has disposed thereon banks 15. The banks 15 define apertures 15a. The apertures 15a define the pixel formation regions P and the sub-pixel formation regions SP. One light-emitting layer 16 is disposed in each aperture 15a. Furthermore, one electron transport layer 17, one second electrode 18, and one sealing layer 19 are disposed in the stated order. Each of these layers covers all of the light-emitting layers 16 and the banks 15 between the light-emitting layers 16. Note that the structure of the panel 10 described above is a mere example, and for example, layers such as the hole injection layer 14, the electron transport layer 17, and the second electrode 18 may be disposed only within the apertures 15a.

Further, although not illustrated in any of the drawings, a plurality of first electrodes 12 may be disposed along the column direction d2 within each of the apertures 15a defined by the banks 15, so that at each sub-pixel formation region SP, a plurality of first electrodes 12 are arranged along the column direction d2. For example, in each aperture 15a, three first electrodes 12 may be disposed along the column direction d2. When making this modification, the three first electrodes 12 may be separately controlled by using separate signals, or the three first electrodes 12 may be controlled by using a single signal. In particular, when controlling the three first electrodes 12 separately by using separate signals, a pixel definition layer composed of an electrical insulator may be disposed between adjacent first electrodes 12 to avoid interference between the adjacent first electrodes 12. When making this modification, it is preferable that the pixel definition layer have a height lower than the height of the banks 15.

The substrate 11 serves as a support of the panel 10. Although not illustrated in any of the drawings, the substrate 11 includes a main body having a rectangular plate-like shape and a thin film transistor (TFT) layer disposed on the main body. The TFT layer includes electronic circuit elements such as TFT elements, capacitor elements, and wiring. The electronic circuit elements in the TFT layer form circuits that supply organic EL elements with current. Also, the TFT layer has, at a top-most portion thereof, an interlayer electrical insulation layer (not depicted) planarizing the top surface of the substrate 11.

The main body of the substrate is formed by using an electrically-insulative material. For example, the material may be soda glass, nonfluorescent glass, phosphate glass, borate glass, quartz, acrylic resin, styrenic resin, polycarbonate resin, epoxy resin, polyethylene, polyester, silicone resin, or alumina. Alternatively, the main body of the substrate 11 may be a plate of a metal, such as aluminum or stainless steel, coated with an electrically-insulative material.

The TFT layer of the substrate 11 includes a laminate structure and the interlayer electrical insulation layer, which covers the laminate structure. The laminate structure includes a semiconductor, an electrical conductor, and an electrical insulator that form various elements and wiring. For example, the semiconductor may be an oxide semiconductor such as indium gallium zinc oxide (IGZO) or an organic semiconductor having a conjugated, planar π electron system, such as a heteroaromatic compound. For example, the electrical conductor may be a metal such as aluminum, copper, or gold, or an electrically conductive oxide such as indium tin oxide (ITO) or indium zinc oxide (IZO). For example, the electrical insulator may be silicon nitride, silicon oxide, silicon oxynitride, aluminum oxide, acrylic resin, polyimide resin, siloxane resin, or phenolic resin. The interlayer electrical insulation layer is formed by using a material that is electrically insulative and that can be patterned. For example, the interlayer electrical insulation layer may be formed by using an organic material such as acrylic resin, polyimide resin, siloxane resin, or phenolic resin.

In the panel 10, the substrate 11 (main body) defines the long-side direction and the short-side direction of the panel 10. Accordingly, the long-side direction and the short-side direction of the main surface of the substrate 11 (main body) are parallel to the row direction d1 and the column direction d2, respectively.

The first electrodes 12 are formed by using, for example, aluminum (Al), silver (Ag), APC (alloy of silver, palladium, and copper), ARA (alloy of silver, rubidium, and gold), MoCr (alloy of molybdenum and chromium), or NiCr (alloy of nickel and chromium). Not only do the first electrodes 12 function as parts of anodes, the first electrodes 12 also have the function of reflecting visible light generated in the light-emitting layers 16 and guiding the visible light upwards.

The light-transmissive electrodes 13 are formed by using, for example, ITO or IZO. Not only do the light-transmissive electrodes 13 function as parts of anodes, the light-transmissive electrodes 13 have the function of improving the adhesion between the first electrodes 12 and the hole injection layer 14 by being disposed therebetween.

For example, the hole injection layer 14 is formed by using a metal compound such as a metal oxide, a metal nitride, or a metal oxynitride. For example, metal oxides usable for forming the hole injection layer 14 include oxides of metals such as chromium (Cr), molybdenum (Mo), tungsten (W), vanadium (V), niobium (Nb), tantalum (Ta), titanium (Ti), zircon (Zr), hafnium (Hf), scandium (Sc), yttrium (Y), thorium (Th), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), stannum (Sn), lead (Pb), antimony (Sb), and bismuth (Bi), and oxides of so-called rare earth metals from lanthanum (La) to lutetium (Lu).

For example, the banks 15 are formed by using an organic material such as resin or an inorganic material such as glass. Examples of organic materials usable for forming the banks 15 include acrylic resin, polyimide resin, and novolac-type phenolic resin. Examples of inorganic material usable for forming the banks 15 include silicon oxide (SiO) and silicon nitride (SiN). As illustrated in FIG. 2, the banks 15 are formed so that the sub-pixel formation regions SP (apertures 15a) have shapes similar to ellipsoids in plan view, having the column direction d2 as a major axis and having the row direction d1 as a minor axis. Specifically, the banks 15 define the apertures 15a such that for each of the apertures 15a, the opposing edges of the aperture 15a in the row direction d1 are linear, and the opposing edges of the aperture 15a in the column direction d2 are semi-circular arcs.

Referring to FIG. 3 once again, the light-emitting layers 16 are formed by using, for example, F8BT(Poly(9,9-di-n-octylfluorene-alt-benzothiadiazole)), which is an organic high polymer. Alternatively, a conventional organic material other than F8BT may be contained in the light-emitting layers 16. Examples of such materials include: a fluorescent material such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound, azaquinolone compound, pyrazoline derivative, pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc., as disclosed in Japanese Patent Application Publication No. H5-163488. In the present embodiment, the light-emitting layers 16 are described as one example of a functional layer.

The electron transport layer 17 is formed by using a material having the function of transporting, to the light-emitting layers 16, electrons that the second electrode 18 injects into the electron transport layer 17. Specifically, the electron transport layer 17 is formed by using, for example, a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, or a quinolone complex derivative, all of which are disclosed in Japanese Patent Application Publication No. H5-163488). Alternatively, the electron transport layer 17 may be formed by using a phosphorous oxide derivative, a triazole derivative, a triazine derivative, a silole derivative, a dimesitylboron derivative, or a triarylboron derivative.

The second electrode 18 is formed by using, for example, ITO or IZO, and functions as a cathode.

The sealing layer 19 has the function of preventing the second electrode 18 and layers therebelow from being exposed to moisture, air, and the like. For example, the sealing layer 19 is formed by using silicon nitride or silicon oxynitride.

3. Manufacturing Method of Organic EL Display Panel 10

Figure 4:
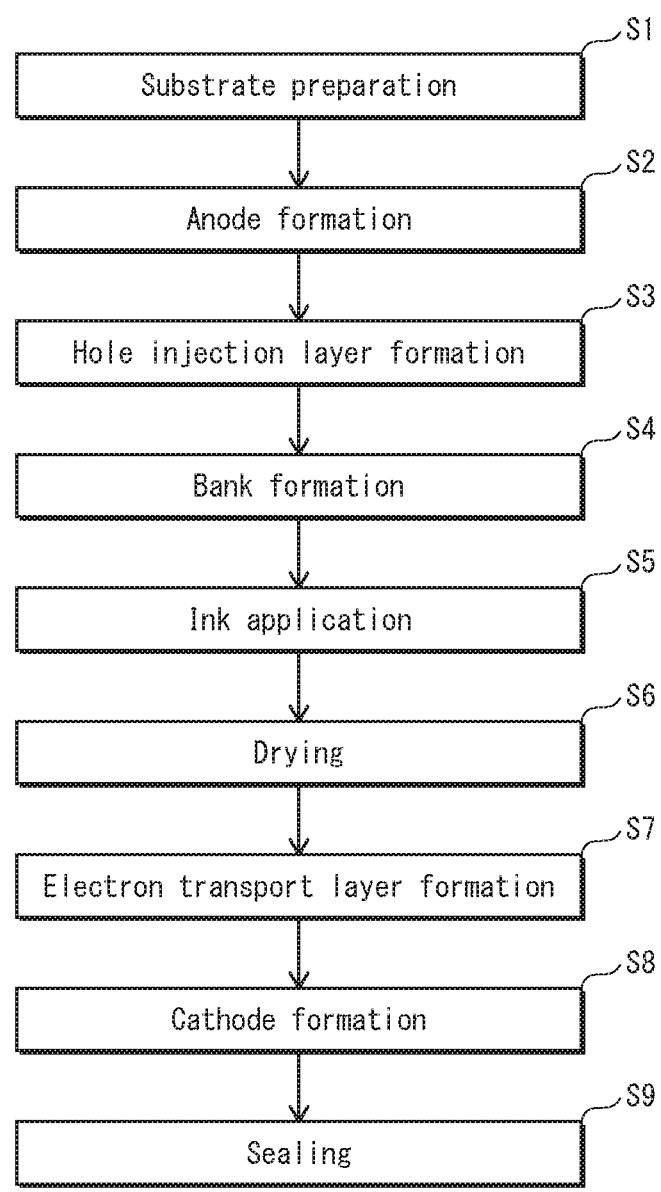
FIG. 4 is a process diagram describing a manufacturing method of the organic EL display panel 10.

FIG. 4 is a process diagram describing a manufacturing method of the panel 10. FIGS. 5A, 5B, 5C, 6A, 6B, 6C, 7A, and 7B are schematic cross-sectional diagrams illustrating manufacturing processes of the panel 10.

(1) Substrate Preparation (S1)

First, the substrate 11 is prepared. Specifically, a main body formed by providing an electrically insulative material with a rectangular plate-like shape is prepared, and the TFT layer is formed on the main body. The TFT layer is formed, for example, through a combination of a thin-film formation method such as sputtering, chemical vapor deposition, or spin coating, and a patterning method such as photolithography. Also, processing such as plasma ion injection and baking may be performed in accordance with needs.

(2) Anode Formation (S2)

Figure 5A:
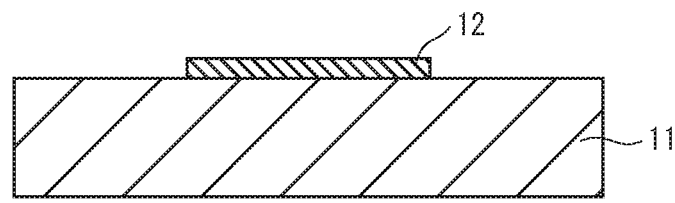
FIGS. 5A, 5B, and 5C are schematic cross-sectional diagrams illustrating manufacturing processes of the organic EL display panel 10, where

Next, anodes are formed on the substrate 11. Each anode is a combination of one first electrode 12 and one light-transmissive electrode 13. Specifically, a thin metal film is first formed through sputtering, for example, and then, the thin metal film is patterned into a matrix through photolithography (FIG. 5A). Thus, the first electrodes 12 are formed on the substrate to form a matrix. Here, the thin metal film may also be formed through vacuum vapor deposition, for example. Then, in a similar manner, a thin ITO film is formed through sputtering, for example, and patterning is performed so that the thin ITO film remains on only the first electrodes 12 through photolithography, for example. Thus, the light-transmissive electrodes 13 are formed. Note that the first electrodes 12 and the transparent electrodes 13 forming a matrix on the substrate 11 may be formed by first forming the thin metal layer and the thin ITO layer, and then performing patterning first with respect to the thin ITO layer and then with respect to the thin metal layer through photolithography.

(3) Hole Injection Layer Formation (S3)

Figure 5B:
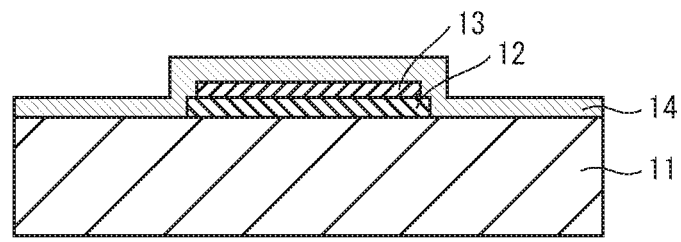

Next, the hole injection layer 14 is formed over the substrate 11 with the transparent electrodes 13 already formed thereon. Specifically, a tungsten oxide film having uniform thickness across the entire top surface of the substrate 11, including the top surfaces of the transparent electrodes 13, is formed through vacuum deposition or sputtering, for example (FIG. 5B). Thus, the hole injection layer 14 is formed.

(4) Bank Formation (S4)

Figure 5C:
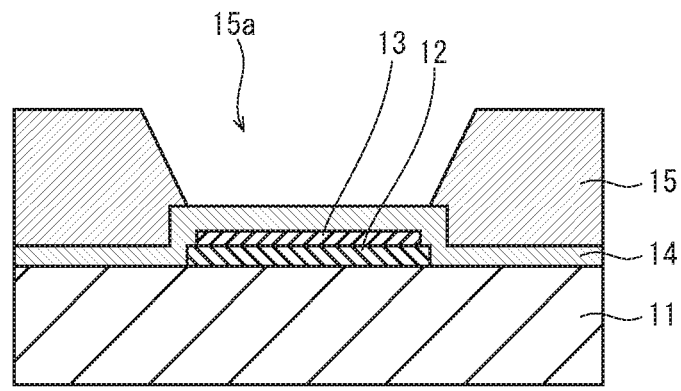

Next, the banks 15 are formed over the substrate 11 with the hole injection layer 14 already formed thereon. Specifically, a resist film containing a photoresist material is formed over the hole injection layer 14 through material application, for example, and then the apertures 15a are formed in the resist layer at positions over the transparent electrodes 13 through photolithography, for example (FIG. 5C). Thus, the banks 15 are formed. The apertures 15a defined by the banks 15 form a matrix and each expose one of the transparent electrodes 13. That is, the apertures 15a define the sub-pixel formation regions SP. Further, the apertures 15a are formed to define the pixel formation regions P, each of which being a set of three sub-pixel formation regions SP lining up in the row direction d1.

(5) Ink Application (S5)

Figure 6A:
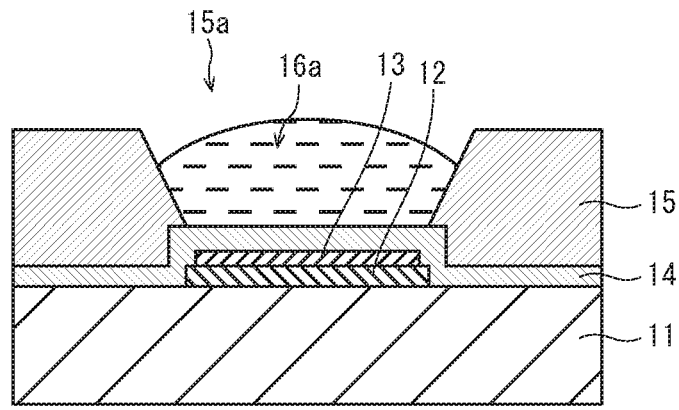
FIGS. 6A, 6B, and 6C are schematic cross-sectional diagrams illustrating manufacturing processes of the organic EL display panel 10, where

Next, ink 16a is applied onto the substrate 11 with the banks 15 already formed thereon. Specifically, the ink 16a, which contains material for the light-emitting layers 16, is applied to each of the apertures 15a (sub-pixel formation regions SP) through inkjet application (FIG. 6A). The details of the application of the ink 16a are described later in the present disclosure.

(6) Drying (S6)

Figure 6B:
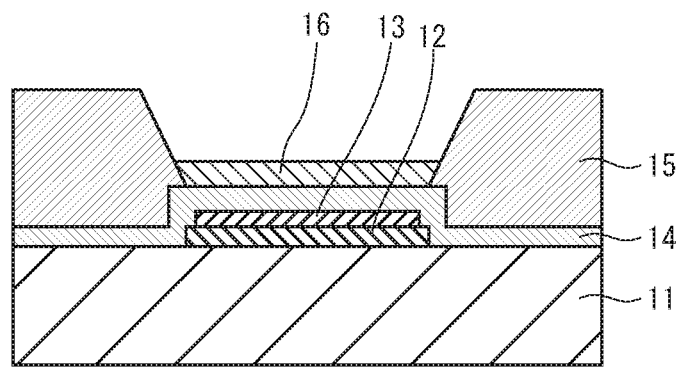

Next, the ink 16a having been applied is dried. Specifically, the drying is performed by evaporating the solvent in the ink 16a by placing the substrate 11 already having received the application of the ink 16a in a vacuum environment (e.g., in a vacuum chamber). Accordingly, the light-emitting layer 16 is formed in each of the sub-pixel formation regions SP (FIG. 6B).

(7) Electron Transport Layer Formation (S7)

Figure 6C:
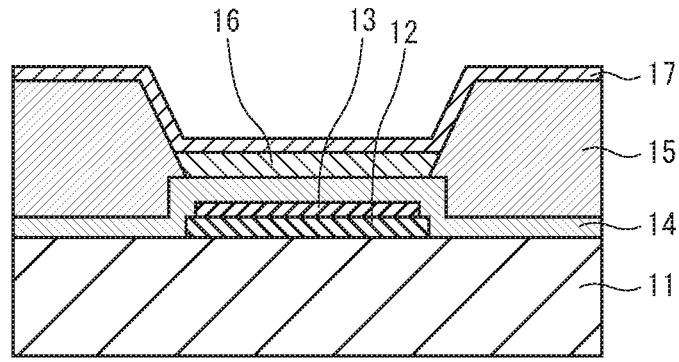

Next, the electron transport layer 17 is formed at a position covering the sub-pixel formation regions SP having the light-emitting layers 16 formed therein. Specifically, a thin film of a material for the electron transport layer 17 is formed to cover the top surface of the layer structure already formed on the substrate 11 through vacuum vapor deposition, for example (FIG. 6C). Thus, the electron transport layer 17 is formed.

(8) Cathode Formation (S8)

Figure 7A:
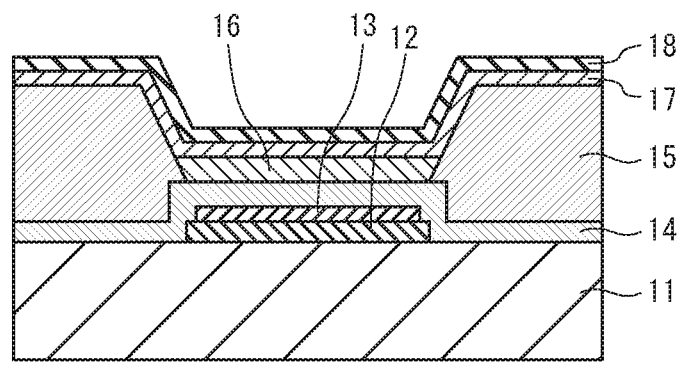
FIGS. 7A and 7B are schematic cross-sectional diagrams illustrating manufacturing processes of the organic EL display panel 10, where

Next, a cathode is formed over the substrate 11 with the electron transport layer 17 already formed thereon. The cathode is composed of the second electrode 18. Specifically, a thin ITO film is formed to cover the top surface of the layer structure already formed on the substrate 11 through sputtering, for example (FIG. 7A). Thus, the second electrode 18 is formed. The second electrode 18 need only be formed at least at a position covering the sub-pixel formation regions SP having the light-emitting layers 16 formed therein.

(9) Sealing (S9)

Figure 7B:
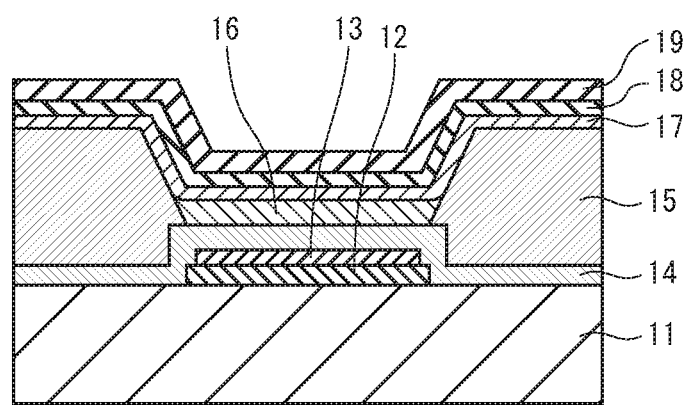

Finally, the substrate 11 having the second electrode 18 already formed thereon is sealed. Specifically, a thin silicon nitride film is formed to cover the layer structure already formed over the substrate 11 through sputtering, for example (FIG. 7B). Thus, the sealing layer 19 is formed. Additionally, after forming the sealing layer 19, a sealing material with a plate-like shape may be adhered onto the top surface of the sealing layer 19 via an adhesive such as an organic resin. This sealing material may include, for example, color filters having the function of correcting light-emission color.

This completes the manufacturing of the panel 10, which has organic EL elements formed in the sub-pixel formation regions SP. Note that the components of the panel 10 need not be formed by using the exemplary methods (e.g., film formation methods and patterning methods) described above. That is, the components may be formed through other methods.

4. Application Method of Ink 16a

The following describes a method of applying the ink 16a through inkjet application, in the manufacturing method of the panel 10.

(1) Description of Inkjet Device 100

Figure 8:
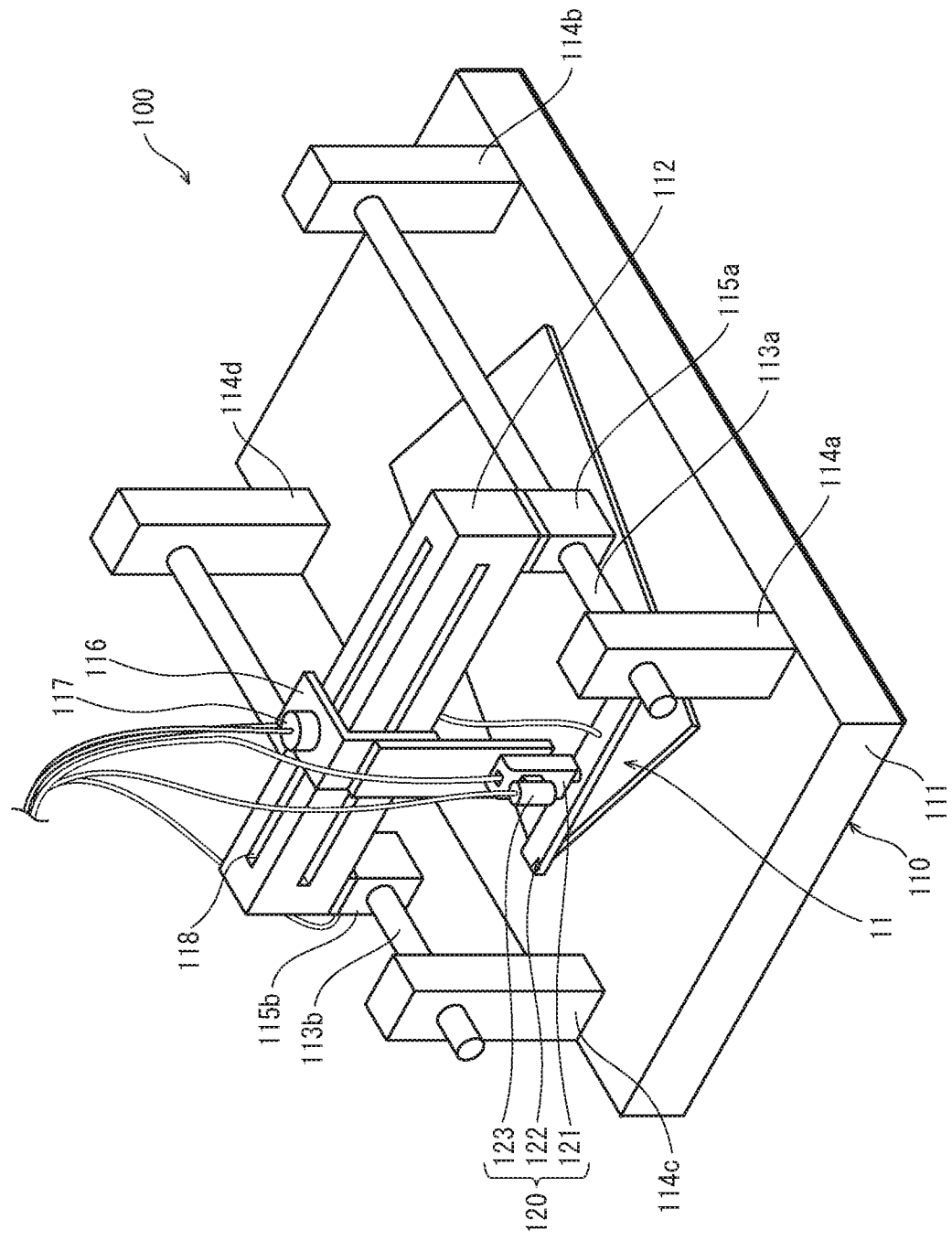

FIG. 8 is a perspective view diagram illustrating an inkjet device 100 used for applying the ink 16a. The inkjet device 100 includes, as main components thereof, a work table 110 and a head unit 120.

a. Work Table 110

The work table 110 is a so-called gantry table, and includes a base 111 and a moving frame 112. The base 111 holds an application target object (the substrate 11 in the present embodiment). The moving frame 112 is arranged over the base 111 and has an elongated shape.

The base 111 is a rectangular solid, and has a rectangular top surface on which the application target object is mounted. Hereinafter, the direction in which the long sides of the top surface of the base 111 extend is referred to as a long-side direction of the base 111, and the direction in which the short-sides of the top surface of the base 111 extend is referred to as a short-side direction of the base 111.

The moving frame 112 is suspended across a pair of guide shafts 113a and 113b arranged in parallel along the long-side direction of the base 111. The guide shafts 113a and 113b are supported by stands 114a, 114b, 114c, and 114d, which are columnar and disposed at four corners of the base 111.

The guide shafts 113a and 113b are respectively equipped with linear motor units 115a and 115b, enabling the moving frame 112 to move in the long-side direction of the base 111.

The moving frame 112 has a mount 116 having an L shape attached thereto. The mount 116 is equipped with a servomotor unit 117. The servomotor unit 117 enables the mount 116 to move in the short-side direction of the base 111 along a guide groove 118.

The linear motor units 115a and 115b and the servo motor unit 117 are connected to a control device (not depicted), and the movement of the moving frame 112 in the long-side direction and the movement of the mount 116 in the short-side direction are controlled by signals from the control device.

Also, in the inkjet device 100, the application target object on the base 11 can be fixed or rotated in a plane parallel to the top surface of the base 111. Thus, the orientation of the application target object relative to the top surface of the base 111 can be set as desired. This is achieved by providing, at a position on the base 111 where the application target object is mounted, a rotating table capable of switching between fixed state and freely rotatable state, for example.

b. Head Unit 120

The head unit 120 includes a main body 121, an inkjet head 122, and an imaging device 123. The main body 121 is fixed to the mount 116 of the work table 110. The inkjet head 122 and the imaging device 123 are attached to the main body 121.

While not illustrated in any of the drawings, the inkjet head 122 is an elongated member having, at a bottom surface thereof, a plurality of nozzles 124N (for example, about ten thousand nozzles 124N) lining up in a straight line in a long-side direction of the inkjet head 122. The nozzles 124N are spaced away from one another, disposed at a fixed nozzle pitch Dn. Accordingly, the nozzles 124N form a nozzle array 124 extending in an extension direction dh, which corresponds to the long-side direction of the inkjet head 122. The nozzles 124N each have a piezoelectric element (undepicted), a liquid chamber (undepicted) connected to the piezoelectric element, and a discharge outlet. When the piezoelectric element presses the liquid chamber, the ink 16a within the liquid chamber is discharged from the discharge outlet.

The main body 121 has a drive circuit (undepicted) for individually driving the piezoelectric elements of the nozzles 124N. The drive circuit is connected to the above-described control device, which provides a signal controlling discharge amount, discharge timing, and the like for each nozzle 124N. The main body 121 further includes a servomotor (undepicted) that is also connected to the control device. This servomotor is capable of causing the inkjet head 122 to rotate in a plane parallel to the top surface of the base 111 with the main body 121 as the rotation center. Accordingly, an angle α between the extension direction dh of the nozzle array 124 and the long-side direction of the base 111 (movement direction of the moving frame 112) can be controlled, and the relative distance of the nozzles 124N from the application target object, i.e., the application distance, can also be controlled.

The imaging device 123 is, for example, a CCD camera connected to the aforementioned control device. The imaging device 123 images a surface of the application target object and transmits image data so acquired to the control device. The control device is capable of judging whether or not to cause each of the nozzles 124N to discharge ink, based on the image data of the application target object transmitted from the imaging device 123. Thus, the nozzles 124N are capable of discharging the ink 16a with respect to only predetermined positions on the application target object.

Note that in the above-described structure, the nozzle array 124 is capable of moving in the long-side direction and the short-side direction of the base 111 due to being indirectly attached to the mount 116 and the moving frame 112 via the main body 121 of the head unit 120.

(2) Usage Method of Inkjet Device 100

For example, in the application of the ink 16a with the inkjet device 100, first the angle α between the extension direction dh of the nozzle array 124 and the long-side direction of the base 111 is set to a predetermined value, and then the application target object is placed on the base 111. Next, the orientation of the application target object relative to the top surface of the base 111 is set. Furthermore, the mount 116 is moved in the short-side direction of the base 116 in accordance with the angle α and the relative orientation of the application target object, to set an area of the application target object to be scanned with the nozzle array 124.

Then, the moving frame is moved to cause the nozzle array 124 to move (this movement of the nozzle array 124 is also referred to in the following as a "scan" by the nozzle array 124) in the long-side direction of the base 111, and the nozzles 124N are each caused to discharge the ink 16a to the application target object when arriving at predetermined positions over the application target object. Thus, for the inkjet device 100, the long-side direction of the base 111 corresponds to a scanning direction ds of the nozzle array 124. Also, due to this, the ink 16a is applied at predetermined positions of the application target object, over which the nozzle array 124 moves.

Note that when the ink 16a cannot be applied to all of the predetermined positions of the application target object through a single scan with the nozzle array 124, the nozzle array 124 is caused to perform another scan after the mount 116 is moved to cause the nozzle array 124 to move in the short-side direction of the base 111.

(3) Method of Applying Ink 16a to Substrate 11

The following describes a method of applying the ink 16a to the substrate 11 using the inkjet device 100.

Figure 9:
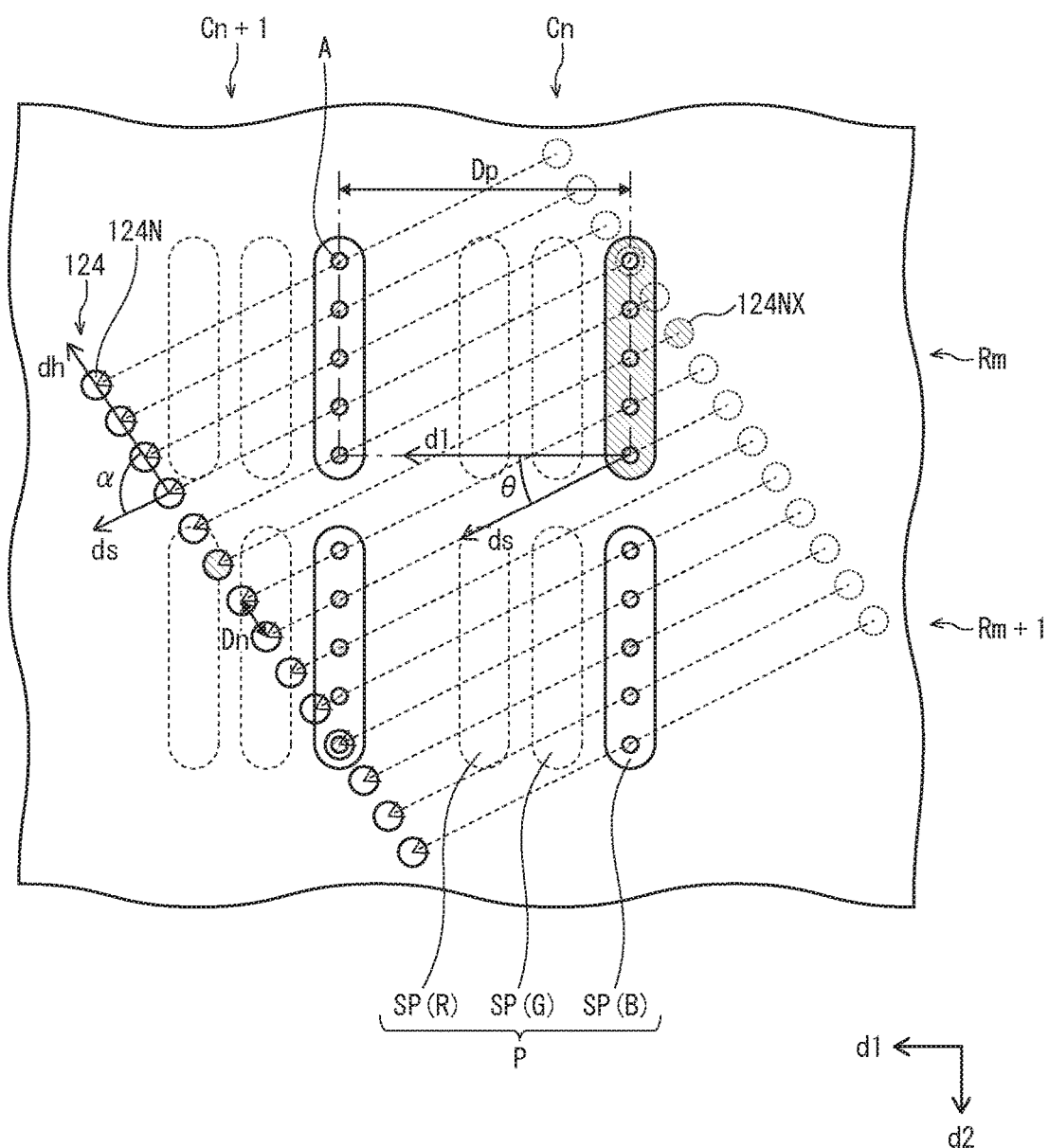
FIG. 9 is a schematic plan view diagram illustrating a scanning direction ds and application positions A of a nozzle array 124.

FIG. 9 is a schematic plan view diagram illustrating the scanning direction ds of the nozzle array 124 and application positions A. FIG. 9 illustrates an example in which the ink 16a is applied to sub-pixel formation regions SP(B) of the pixel formation regions P. For ease of explanation, in the matrix formed by the four pixel formation regions P illustrated in FIG. 9, the ones of the pixel formation regions P illustrated in the upper side of page are considered as belonging to row Rm and the ones of the pixel formation regions P illustrated in the lower side of the page are considered as belonging to row Rm+1, and the ones of the pixel formation regions P illustrated in the right side of the page are considered as belonging to column Cn and the ones of the pixel formation regions P illustrated in the left side of the page are considered a belonging to column Cn+1.

The application of the ink 16a to the substrate 11 in the present embodiment takes advantage of the fact that the orientation of the application target object relative to the top surface of the base 111 can be changed with the inkjet device 100. Specifically, an angle θ between the row direction d1, which is one direction in which pixel formation regions P line up on the substrate 11, and the scanning direction ds of the nozzle array 124 is set to more than 0° and less than 90°.

When setting the angle θ in such a manner, the scanning direction ds is inclined by the angle θ relative to the row direction d1. FIG. 9 illustrates an example where the nozzle array 124 moves from the upper right of the page toward the lower left of the page. Also, the nozzles 124N apply the ink 16a to the exact row-direction centers of the sub-pixel formation regions SP. Accordingly, the application positions A of the ink 16A line up along the column direction d2.

When making such a configuration, even when for example the nozzle array 124 includes a nozzle 124NX having a discharge amount smaller or greater than that of the rest of the nozzles 124N in the nozzle array 124, the nozzle 124NX applies the ink 16a across multiple rows of sub-pixel formation regions SP, or in other words, the sub-pixel formation regions SP receiving the ink 16a from the nozzle 124NX do not line up in the row direction d1. Specifically, in FIG. 9, at the column Cn, the nozzle 124NX (emphasized with diagonal hatching) passes over and applies the ink 16a with respect to the sub-pixel formation region SP(B) belonging to row Rm (emphasized with diagonal hatching). Meanwhile, at column Cn+1, the nozzle 124NX arrives at the midpoint between row Rm and row Rm+1. This is since due to the angle θ, the arrival position of the nozzle 124NX at column Cn+1 is offset downwards in the column direction with respect to the arrival position of the nozzle 124NX at column Cn. Thus, at the column Cn+1, the nozzle 124NX does not apply the ink 16a with respect to the sub-pixel formation region SP(B) belonging to row Rm, and accordingly sub-pixel formation regions SP(B) receiving the ink 16a from the nozzle 124NX do not line up in the row Rm.

Here, the nozzle 124NX may pass over sub-pixel formation regions SP(B) in the same row Rm at both column Cn and column Cn+1 should, for example, the nozzle 124NX, at column Cn, pass over a top end portion of the sub-pixel formation region SP(B) belonging to row Rm in FIG. 9, or the angle θ be set to a small angle. However, even if the nozzle 124NX should pass over sub-pixel formation regions SP(B) in the same row Rm at both column Cn and column Cn+1, there will be at least one column beyond column Cn+1 (or before column Cn) at which the nozzle 124NX, moving with the angle θ kept the same, does not pass over a sub-pixel formation region SP(B) belonging to row Rm. Particularly, in display panels, the length of an array of pixel formation regions P lining up in the row direction d1 is much greater than the size of a single pixel formation region P. Due to this, even if the angle θ is set to an extremely small angle, the nozzle 124N would apply the ink 16a across multiple rows as long as the scanning direction ds, defined by the angle θ, is inclined with respect to the row direction d1.

As such, in the panel 10, which is manufactured according to the above-described method, the risk is low of faulty pixels lining up in the row direction d1. Here, faulty pixels refer to pixels having high or low luminance compared to other pixels, pixels not emitting any light, or pixels emitting a color not matching the desired color, produced due to the difference in discharge amounts of the nozzles 124N. Accordingly, the manufacturing method pertaining to the present embodiment reduces the risk of occurrence of a linear unevenness in luminance, light-emission color, etc., along the row direction d1 (i.e., a pixel arrangement direction), caused by a difference in discharge amounts of nozzles.

5. Notes (1) Beneficial Values of Angle θ

The manufacturing method of the panel 10 achieves the above-described effects when the angle θ is set to any angle more than 0° and less than 90°. Nevertheless, setting the angle θ to certain angles would produce additional effects.

For example, it is preferable that the angle θ be set to satisfy Dp×tan θ≠Dp2, for Dp denoting the pitch between pixel formation regions P lining up in the row direction d1 and Dp2 denoting the pitch between pixel formation regions lining up in the column direction d2. Setting the angle θ to satisfy Dp×tan θ≠Dp2 is preferable for the following reason. When angle θ is set to satisfy Dp×tan θ=Dp2, the scanning with the nozzle array 124 results in application positions of the nozzles 124N differing by exactly Dp2 from column to column. This means that the combinations of nozzles 124N performing application to the pixel formation regions P remaining the same. Accordingly, pixel formation regions P that are similar to one another in terms of the amount of the ink 16a applied thereto lining up in the scanning direction ds, which leads to a linear unevenness in luminance, light-emission color, etc., occurring along the scanning direction ds.

Meanwhile, when the angle θ is set to satisfy Dp×tan θ≠Dp2, the combination of nozzles 124N performing application changes from one pixel formation region P to another. Thus, the risk is reduced of occurrence of a linear unevenness in luminance, light-emission color, etc., along the scanning direction ds.

Also, in the manufacturing method of the panel 10, it is preferable that the angle θ be set so as to satisfy Math. 1, below, where N is a positive integer.

$$\theta = \sin^{-1}\left(\frac{N \cdot Dn \cdot \sin \alpha}{Dp}\right) \quad [\text{Math. 1}]$$

Figure 10A:
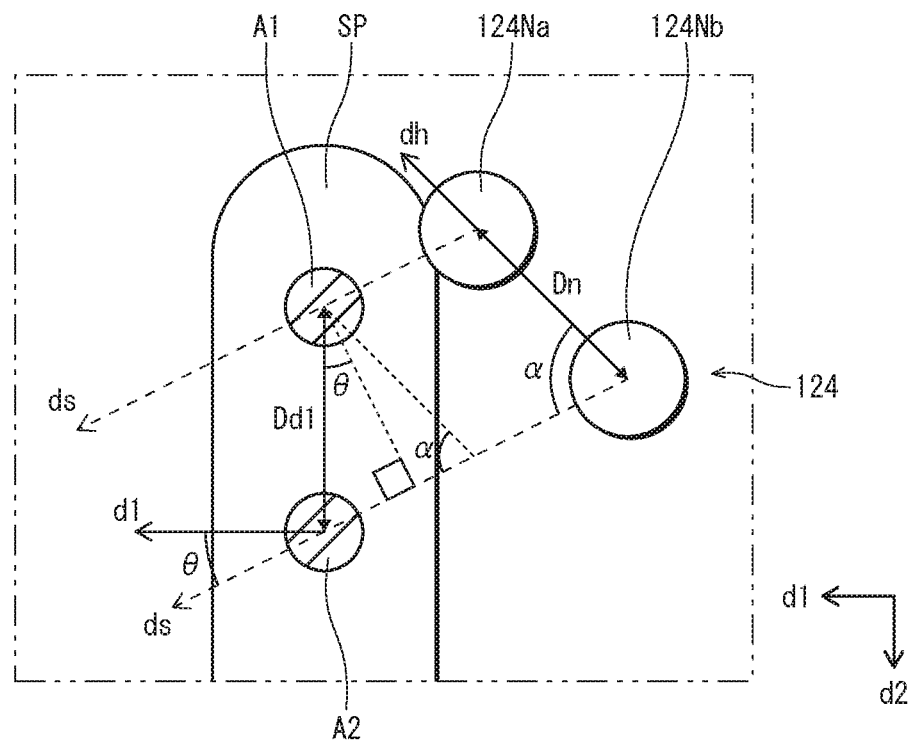
FIG. 10A is a diagram illustrating pitch Dd1 between application positions corresponding to adjacent nozzles 124Na and 124Nb.
Figure 10B:
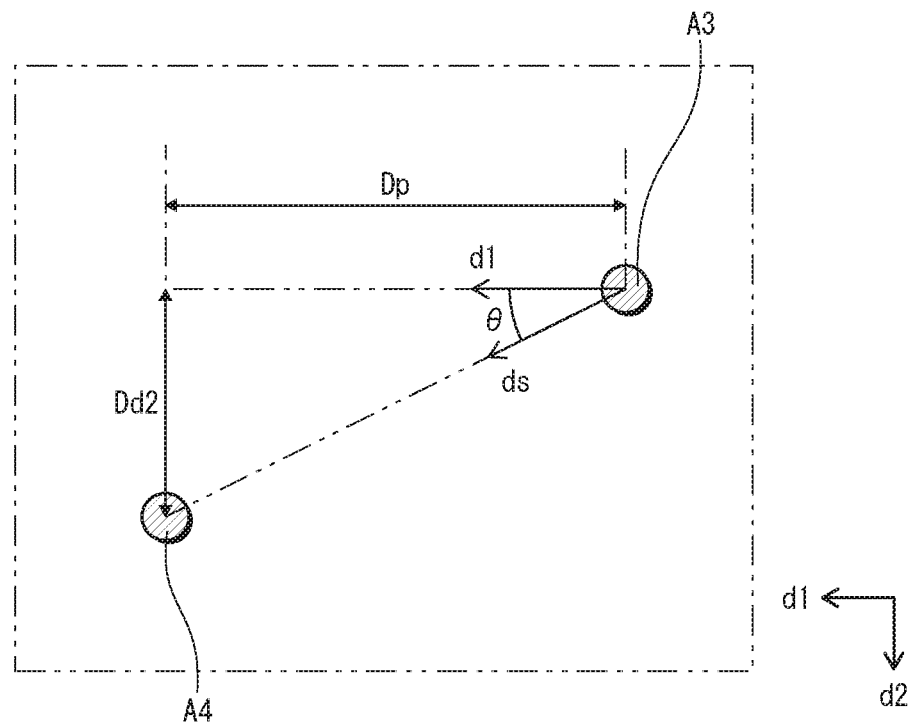
FIG. 10B is a diagram illustrating an offset Dd2 in a column direction d2, between nozzle application positions A3 and A4 in adjacent pixel formation regions P.

FIG. 10A is a diagram illustrating pitch Dd1 between application positions of adjacent nozzles 124Na and 124Nb in a sub-pixel formation region SP, and FIG. 10B is a diagram illustrating an offset Dd2 in the column direction d2 between application positions A3 and A4 of one nozzle in adjacent pixel formation regions P.

According to FIG. 10A, with α denoting the angle between the extension direction dh and the scanning direction ds of the nozzle array 124, D1·cos θ=Dn·sin α is satisfied, where Dn denotes the pitch between adjacent nozzles 124Na and 124Nb, and Dd1 denotes the pitch between application positions A1 and A2 of the ink 16a within one sub-pixel formation region SP, respectively corresponding to the nozzles 124Na and 124Nb.

Also, as illustrated in FIG. 10B, Dd2=Dp·tan θ is satisfied, where Dd2 denotes an offset in the column direction d2 between application position A3 in one column receiving the ink 16a from a nozzle 124N (undepicted) and application position A4 in an adjacent column receiving the ink 16a from the same nozzle 124N.

Here, when the angle θ satisfies Math. 1 given above, then Dd2=Dp·(sin θ/cos θ)=(N·Dn·sin α)/cos θ=N·Dd1. This means that between pixel formation regions P adjacent in the row direction d1, the position in the column direction d2 above which a same nozzle 124N passes (application position A) differs by exactly N (positive integer) times the pitch Dd1 between application positions of the ink 16a. Accordingly, nozzles 124N pass above the same column-direction positions of all pixel formation regions P lining up along the row direction d1. That is, application positions A of the ink 16a remain the same in all pixel formation regions P lining up in the row direction d1. Thus, the risk is low of positions in the column direction d2, numbers, etc., of application positions A differing among pixel formation regions P lining up in the row direction d1. Thus, the risk is reduced of occurrence of application unevenness along the row direction d1. Accordingly, setting the angle θ to satisfy Math. 1 reduces the risk of occurrence of a linear unevenness in luminance, light-emission color, etc., along the row direction d1.

(2) Value of N for Sub-Pixel Formation Regions SP

As described above, when the angle θ satisfies Math. 1, the application positions A of nozzles 124N in one pixel formation region P differ in the column direction d2 by N·Dd1 from the application positions A of nozzles 124N in a pixel formation region P adjacent in the row direction d1. In other words, N indicates the number of nozzles 124N that are replaced with other nozzles 124N between pixel formation regions P adjacent in the row direction d1. Accordingly, the larger the value of N, the smaller the risk of the influence of the difference among the nozzles 124N appearing in the row direction d1. Thus, the larger the value set to N, the lower the risk of occurrence of a linear unevenness in luminance, light-emission color, etc.

Here, in the panel 10, each pixel formation region P has sub-pixel formation regions SP(R), SP(G), and SP(B), respectively corresponding to the colors red (R), green (G), and blue (B). Further, different inks 16a are applied to sub-pixel formation regions of different colors, in order to form light-emitting layers having different light emission colors. In the following, the different inks applied to the sub-pixel formation regions SP(R), SP(G), and SP(B) are respectively referred to as a first ink 16a(R), a second ink 16a(G), and a third ink 16a(B). Further, when there is a need to refer to these ink collectively, the term inks 16a (R), (G), (B) is used.

In the manufacturing method of the panel 10, it is preferable that the application of the different inks 16a (R), (G), and (B) be performed separately by performing scanning with the nozzle array 124 each time with respect to only the corresponding sub-pixel formation regions (i.e., the sub-pixel formation regions SP(R), the sub-pixel formation regions SP(G), or the sub-pixel formation regions SP(B)). Performing scanning separately in such a manner allows varying the value of N among the different inks 16a (R), (G), and (B). Note that in the following, the scanning direction ds in the application of the first ink 16a (R) is termed a first scanning direction ds1, the scanning direction ds in the application of the second ink 16a (G) is termed a second scanning direction ds2, and the scanning direction ds in the application of the third ink 16a (B) is termed a third scanning direction ds3.

Figure 11:
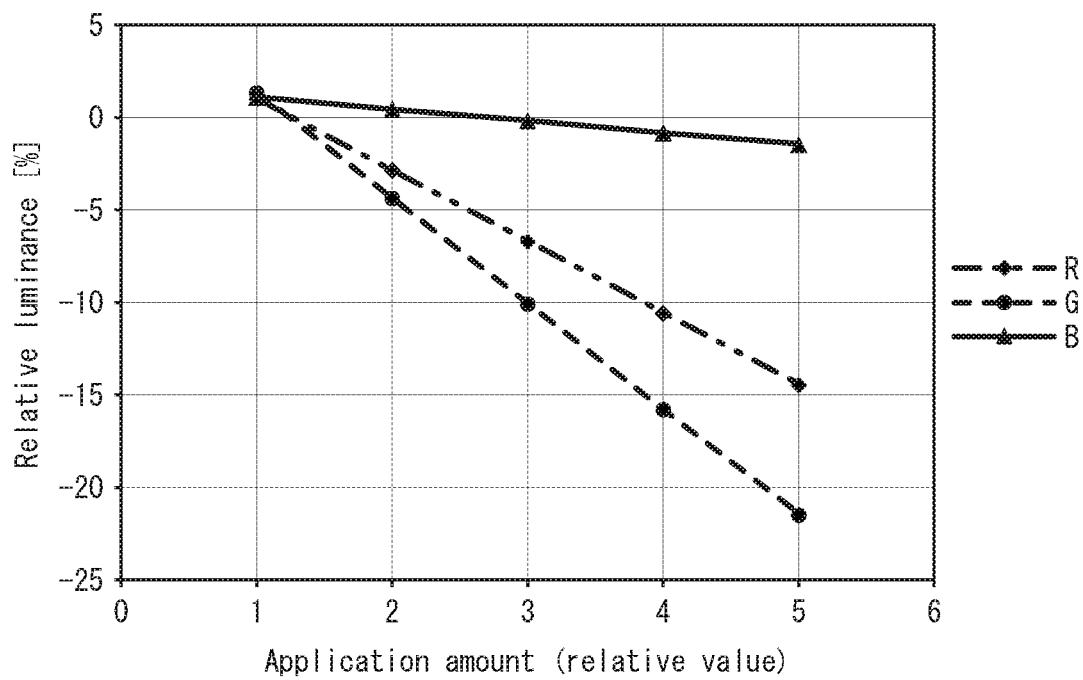

FIG. 11 shows graphs indicating the relationship between application amount and relative luminance for samples of inks 16a. In FIG. 11, relative values are plotted on the horizontal axis and the vertical axis. The vertical axis plots application amounts of the samples of the inks 16a relative to a predetermined application amount indicated by using the value 1, and the horizontal axis indicates change from a predetermined luminance. These graphs each indicate the relationship for a specific sample of a corresponding one of the inks 16a (R), (G), (B). Note that using other samples of the inks 16a (R), (G), (B) would result in the relationship differing from that illustrated in FIG. 11, specifically in the graphs having different inclinations.

As indicated in FIG. 11, the dependency of luminance with respect to application amount differs among the samples of the inks 16a (R), (G), (B). Specifically, while luminance is very dependent upon application amount for the sample of the second ink 16a (G), luminance is not so dependent upon application amount for the sample of the third ink 16a (B). This is believed to reflect the fact that typically, human visual sensitivity is more sensitive to change in the color green and less sensitive to change in the color blue.

The above shows that the influence of the difference among the nozzles 124N with respect to luminance is relatively great in the application of the sample of the second ink 16a (G). Thus, it is preferable that the angle θ be set so that the value N defining the second scanning direction ds2 in the application of the sample of the second ink 16a (G) is greater than or equal to the value N defining the first scanning direction ds1 and the value N defining the third scanning direction ds3. More generally, it is preferable that the angle θ be set to that the value N defining the scanning direction in the application of one of the inks 16a (R), (G), (B) for which luminance is most dependent upon application amount is equal to or greater than the value N defining the scanning direction in the application of each of the other ones of the inks 16a (R), (G), (B).

Figure 12:
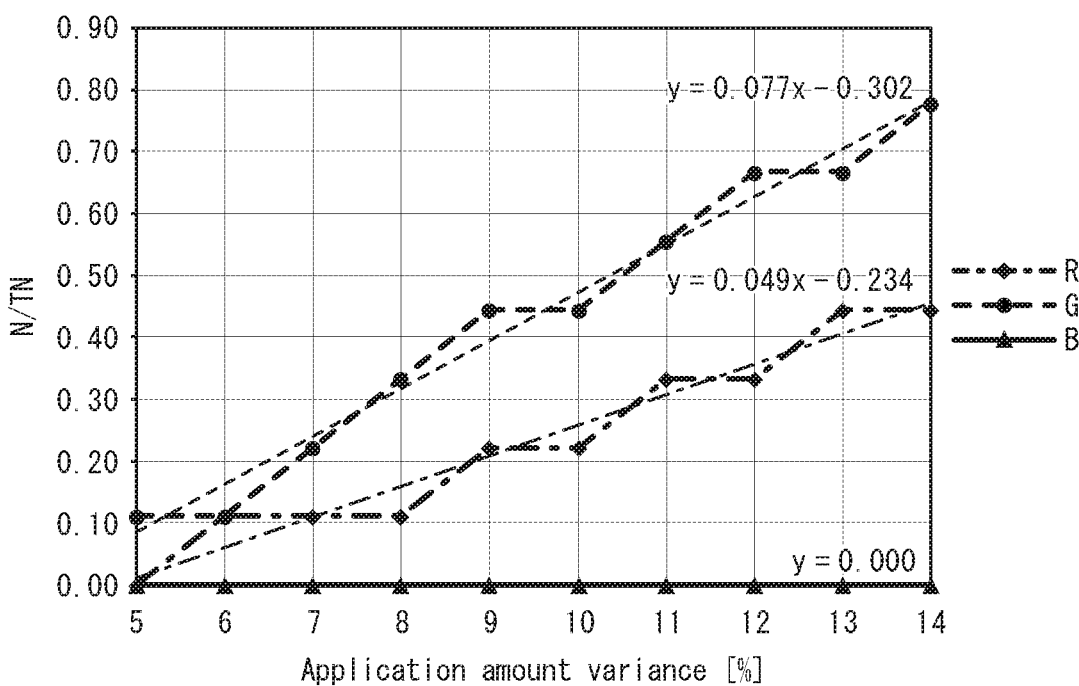

FIG. 12 shows graphs indicating the relationship between application amount variance and ratio N/TN for samples of inks 16a. In FIG. 12, application amount variance is plotted along the horizontal axis. Application amount variance differs for different samples of the ink 16a, and application amount variance for a given sample of the ink 16a is a percentage calculated by dividing, by average application amount when causing nozzles 124N to discharge the sample of the ink 16a multiple times, a greater one of a difference between the average application amount and the maximum application amount and a difference between the average application amount and the minimum application amount. Further, TN denotes the number of nozzles 124N applying ink with respect to each sub-pixel formation region SP (the term application nozzle count TN is also used in the following). Accordingly, the ratio N/TN plotted along the vertical axis in FIG. 12 indicates the ratio of the number of nozzles 124N that are replaced with other nozzles 124N between pixel formation regions P adjacent in the row direction d1, to the application nozzle count TN.

The graphs of FIG. 12 deductively indicate the results of an observation that the present inventor conducted. In the observation, the present inventor applied samples of inks 16a of different colors to the corresponding sub-pixel formation regions with different angles θ, and checked the occurrence of linear unevenness in luminance in the sub-pixel formation regions SP. Specifically, the graphs of FIG. 12 indicate, with respect to the application amount variance of different samples of the ink 16a, N/TN values with which the occurrence of linear unevenness in luminance is sufficiently prevented. For example, the graphs in FIG. 12 show that for one sample of the ink 16a (R) whose application amount variance when applied with respect to the sub-pixel formation regions SP(R) was found to be 9% through the observation, the occurrence of linear unevenness in luminance can be sufficiently prevented by setting the angle θ such that N/TN is no less than 0.22.

FIG. 12 also shows, using dashed lines, straight lines approximating the results of the observation. For samples of the ink 16a, it is preferable that the angle θ be set so that the N/TN value is above the corresponding straight line. That is, when denoting application amount variation as X %, it is preferable to set the angle θ to satisfy Math. 5 below for the first scanning direction ds1 (i.e., in the application of samples of the first ink 16a (R)), and to satisfy Math. 6 below for the second scanning direction ds2 (i.e., in the application of samples of the second ink 16a (G)).

$$\frac{N}{TN} \geq 0.05X - 0.23 \quad \text{[Math. 5]}$$

$$\frac{N}{TN} \geq 0.08X - 0.30 \quad \text{[Math. 6]}$$

Here, since the dependency of luminance on application amount is relatively low for the third scanning direction ds3 (i.e., in the application of samples of the third ink 16a (B)), the N/TN value (i.e., the angle θ) for the third scanning direction ds3 may be set to any value.

(3) Preferable Relationship Between Angle θ and Shape of Sub-Pixel Formation Region SP In the panel 10, the apertures 15a, that is, the sub-pixel formation regions SP are formed to have elongated shapes and such that a long-side direction thereof is orthogonal to the row direction d1. Specifically, as illustrated in FIG. 2, the sub-pixel formation regions SP are each formed to have a substantially elliptical shape having the column direction d2 as a major axis direction and having the row direction d1 as a minor axis direction.

Here, in the application of the ink 16a with respect to the sub-pixel formation regions SP, the greater the application nozzle count TN, the relatively smaller the influence of difference in discharge amounts of the nozzles 124N. In order to increase the application nozzle count TN, it is preferable that the scanning direction ds (i.e., first scanning direction ds1, the second scanning direction ds2, and the third scanning direction ds3) of the nozzle array 124 is set closer to the minor axis direction d1 of the sub-pixel formation regions SP than the major axis direction d2 of the sub-pixel formation regions SP. In other words, it is preferable to set the angle between the scanning direction ds of the nozzle array 124 and the minor axis direction d1 of the sub-pixel formation regions SP, that is, the angle θ, to be greater than 0° and no more than 45°.

(4) Preferable Range of N

In the application of the ink 16a with respect to the sub-pixel formation regions SP, it is preferable to set the angle θ to satisfy Math. 2 below, where Lsp denotes the length of the sub-pixel formation regions SP in the long-side direction thereof.

$$\theta \leq \tan^{-1}\left(\frac{Lsp}{Dp}\right) \quad \text{[Math. 2]}$$

Figure 13:
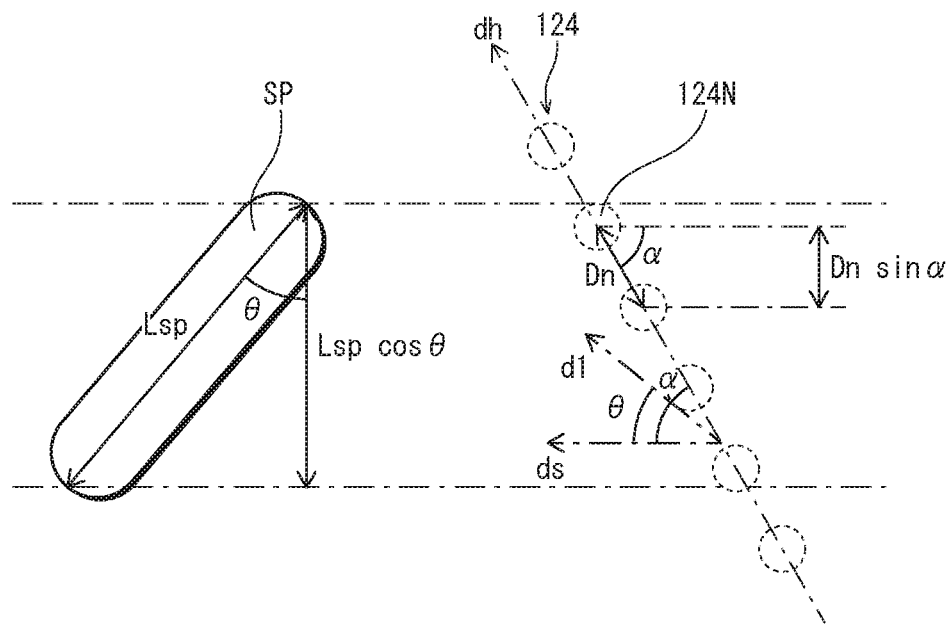
FIG. 13 is a schematic plan view diagram illustrating scanning of sub-pixel formation regions SP with the nozzle array 124 and with angles θ and α.

FIG. 13 is a schematic plan view diagram illustrating scanning of the sub-pixel formation regions SP with the nozzle array 124 and with the angles θ and α. According to FIG. 13, the application nozzle count TN is either [(Lsp·cos θ)/(Dn·sin α)] or [Lsp·cos θ)/Dn·sin α)]+1. Here, the symbols in square brackets are Gauss symbols, where [A] represents a maximum integer not exceeding A. Accordingly, A is no less than [A] and less than [A]+1.

Meanwhile, as described above, N indicates the number of nozzles 124N that are replaced with other nozzles 124N between pixel formation regions P adjacent in the row direction d1. Here, when the angle θ satisfies the equation of Math. 2, N is expressible as: N=Dd2/Dd1=(Dp·tan θ)/((Dn·sin α)/cos θ))=(Lsp·cos θ)/(Dn·sin α). Thus, N is nearly equal to the application nozzle count TN.

This means that, when the angle θ satisfies the equation of Math. 2, the nozzles 124N used for application are almost completely replaced between pixel formation regions P adjacent in the row direction d1, and thus the influence of the difference in discharge amount among the nozzles 124N barely appears in the row direction d1. Meanwhile, setting angles greater than this to angle θ brings about substantially no change in terms of the effect of reducing the risk of occurrence of linear unevenness in luminance, light-emission color, etc. In fact, setting angles greater than this to angle θ brings about problems such as an increase in the number of nozzles 124N required to perform application with respect to all of the sub-pixel formation region SP, and a risk arising of the influence of the difference in discharge amount among the nozzles 124N appearing in the column direction d2. Thus, it is preferable that N is no greater than TN, and in other words, it is preferable that the angle θ is set to satisfy Math. 2.

(5) Preferable Range of Angle α

Angle α is the angle between the scanning direction ds and the extension direction dh of the nozzle array 124, and is a parameter changing the application pitch Dd1. It is preferable that angles α and θ satisfy Math. 3 below.

$$\alpha \leq 90° - \theta \quad \text{[Math. 3]}$$

When Math. 3 is satisfied, the application nozzle count TN satisfies the inequality of Math 7 below.

$$TN \geq \left[\frac{Lsp \cdot \cos\theta}{Dn \cdot \sin\alpha}\right] \geq \left[\frac{Lsp \cdot \cos\theta}{Dn \cdot \sin(90° - \theta)}\right] = \left[\frac{Lsp}{Dn}\right] \quad \text{[Math. 7]}$$

Here, the right-hand side of Math. 7 is substantially equal to the application nozzle count when θ=0° and α=90°, in other words, the application nozzle count in typical inkjet application. Thus, setting the angle α to satisfy Math. 3 ensures that the application nozzle count TN is at least equal to the application nozzle count in typical inkjet application, and thus, the risk can be reduced of the occurrence of a linear unevenness in luminance, light-emission color, etc., without bringing about an increase in variance among pixels in terms of luminance, light-emission color, etc.

(6) Scan Count Relative to Angle θ

In the application of the ink 16*a* with respect to the sub-pixel formation regions SP, it is preferable the angle θ is set to satisfy Math. 4 below, where W denotes the length of the substrate 11 in the long-side direction, H denotes the length of the substrate 11 in the short-side direction, and L denotes the length of the nozzle array 124 in the extension direction dh.

$$\left[\frac{H\cos\theta + W\sin\theta}{L\sin\alpha}\right] = \left[\frac{H}{L\sin\alpha}\right] \quad \text{[Math. 4]}$$

Figure 14:
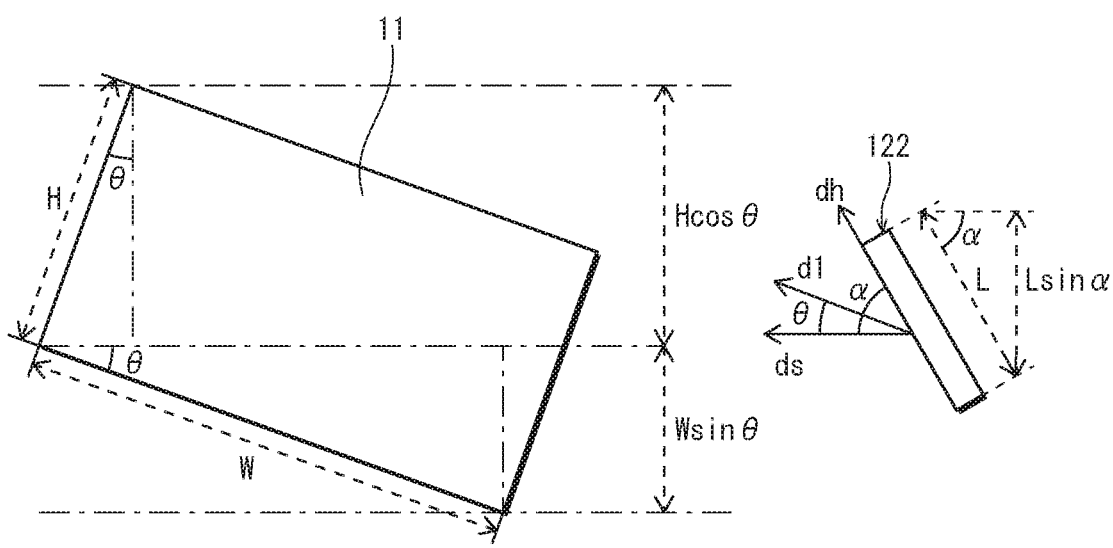
FIG. 14 is a schematic plan view diagram describing a scan count of the inkjet device 100.

FIG. 14 is a schematic plan view diagram describing the number of times the inkjet device 100 performs scanning (referred to as scan count in the following). FIG. 14 illustrates an example where the inkjet head 122 depicted at the right-hand side of the page moves in the scanning direction ds and applies the ink 16*a* over the substrate 11.

As illustrated in FIG. 14, when performing scanning with the nozzle array 124 and with the angles θ and a, the minimum scan count required in order to apply the ink 16*a* over the entire surface of the substrate 11 can be calculated by adding one to the left-hand side value of Math. 4. Meanwhile, when the angle θ is 0°, the minimum scan count can be calculated by adding one to the right-hand side value of Math. 4. This means that when Math. 4 is satisfied, the ink 16*a* can be applied over the entire surface of the substrate 11 without increasing the scan count from that in typical inkjet application. Thus, an increase in manufacturing procedures can be prevented.

Note that in the description above, the difference between the size of the image display face of the substrate 11 and the size of the pixel arrangement region is not considered for being presumably small (that is, the vessel portion is not considered), and also, the difference between the length of the inkjet head 122 in the long-side direction thereof and the total length L of the nozzle array 124 is not considered for being presumably small.

(7) Other Matters

In mathematical formulae Math. 1 through Math. 7 given in the present disclosure, equalities therein need not be satisfied in a strict sense, and instead, the equalities may be considered to be established when there is a match in a practical level. For example, when comparing a right-hand side and a left-hand side of an equation, equality may be considered to be established between the left-hand side and the right-hand side when the leading two significant figures match.

Figure 15:
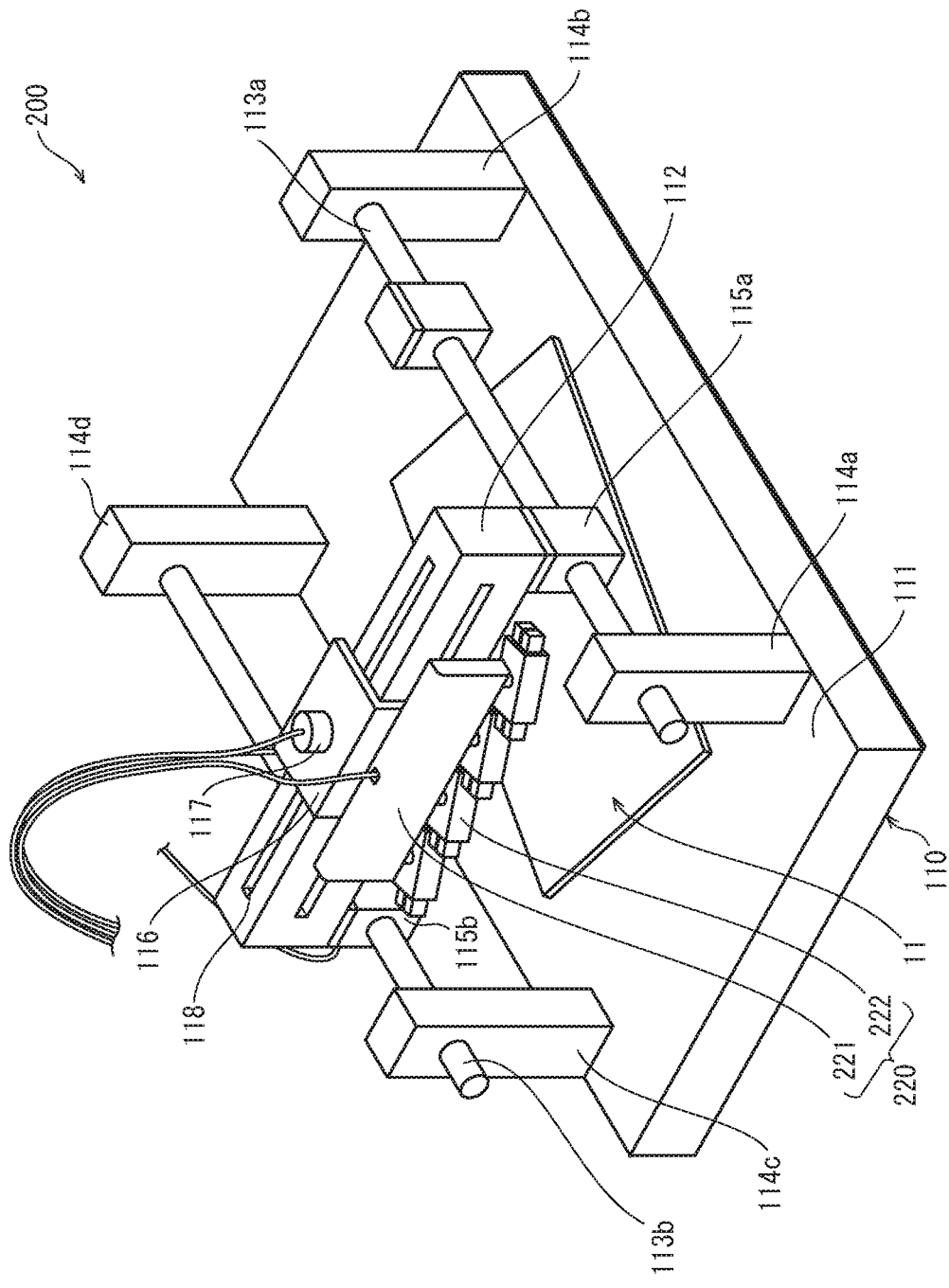
FIG. 15 is a perspective view diagram illustrating an inkjet device 200 pertaining to a modification.
Figure 16:
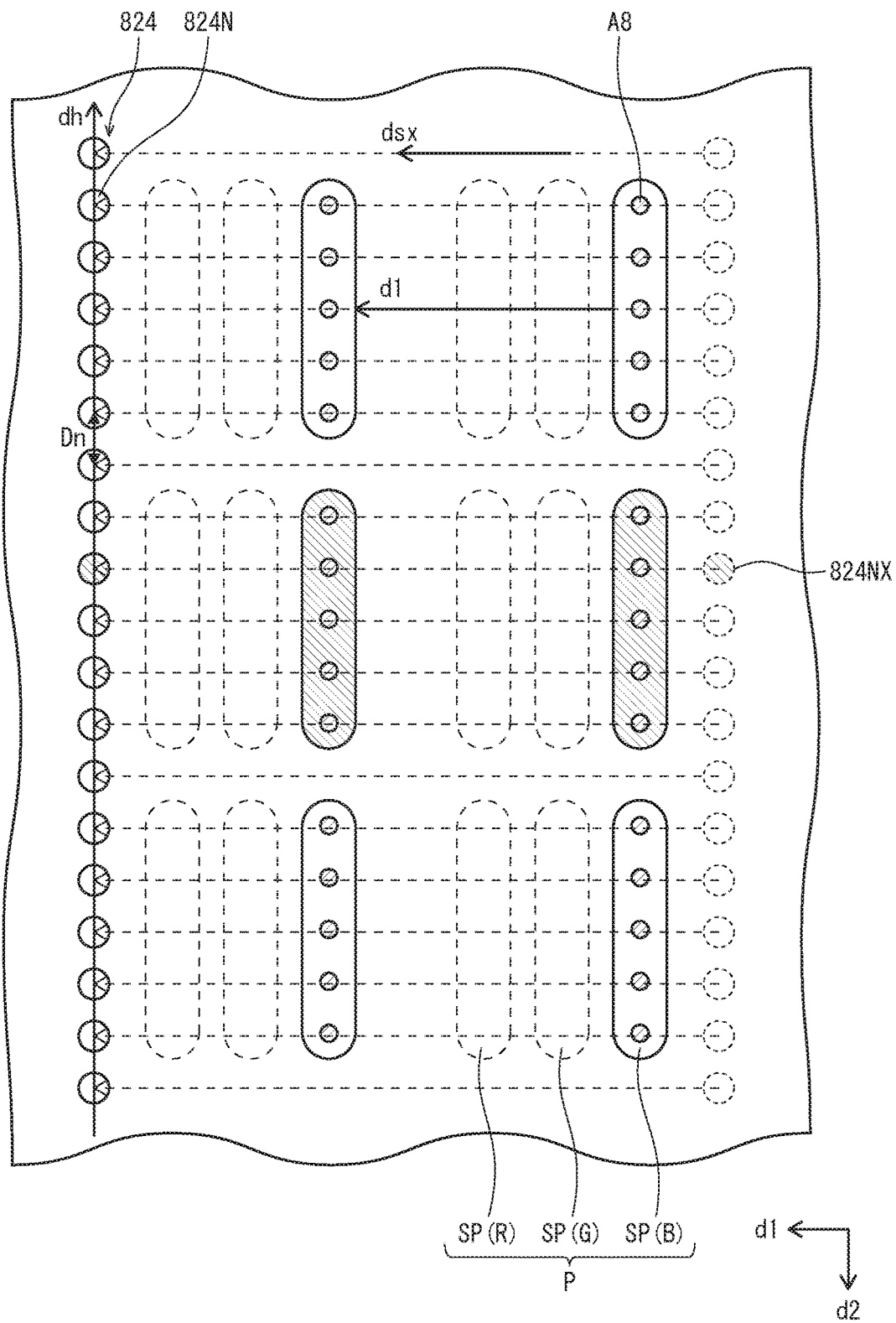
FIG. 16 is a schematic plan view diagram illustrating a scanning direction dsx and application positions A8 of a nozzle array 824.
Figure 17:
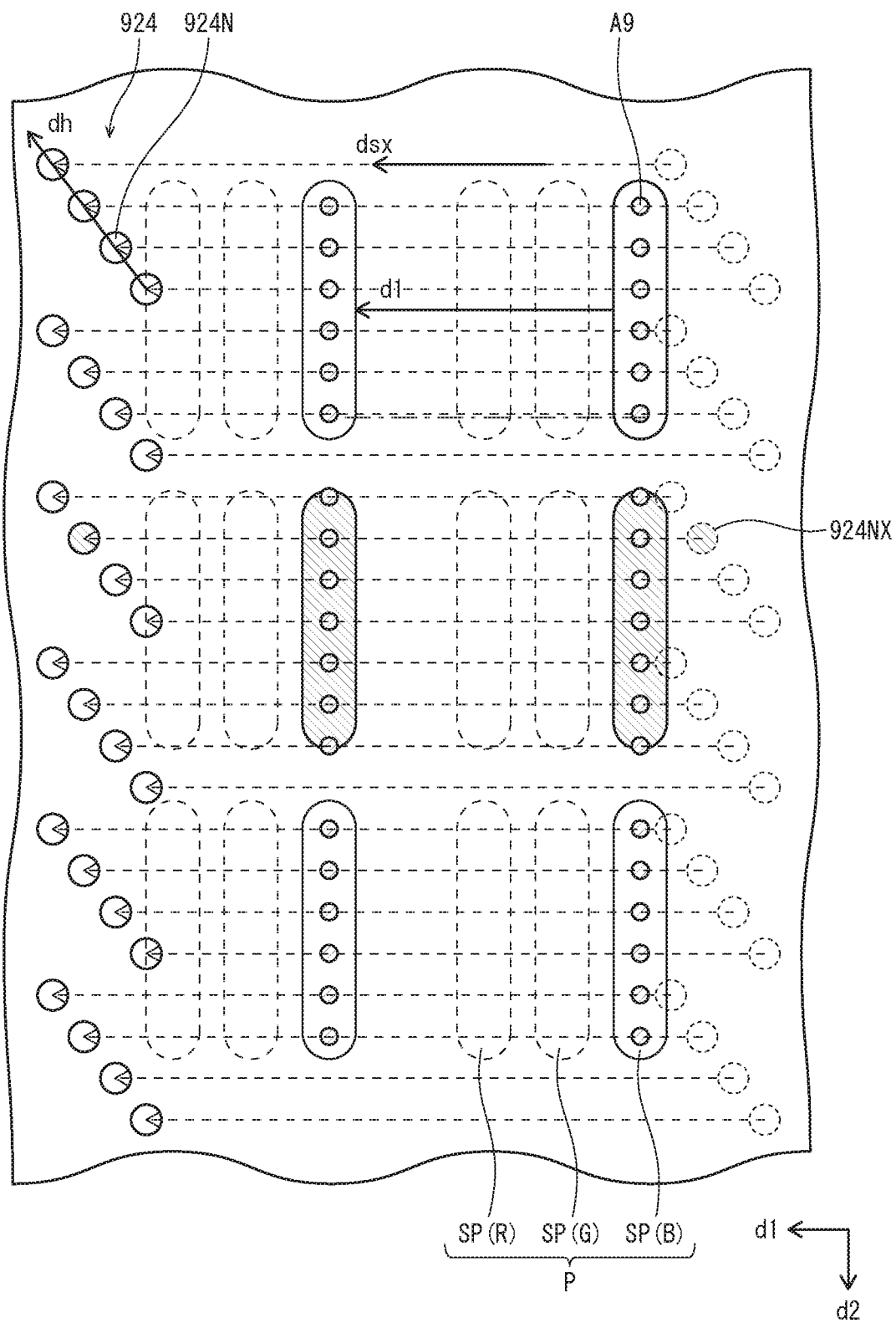
FIG. 17 is a schematic plan view diagram illustrating a scanning direction dsx and application positions A9 of nozzle arrays 924.

In the present embodiment, the nozzles 124N in the inkjet device 100 line up to form one straight line. However, the nozzles 124N need not form a single straight line. FIG. 15 is a perspective view diagram indicating an inkjet device 200 pertaining to a modification. In the inkjet device 200, a head unit 220 has a plurality of inkjet heads 222 attached thereto, and each inkjet head has a plurality of nozzles 124N lining up in a straight line. That is, the nozzles 124N may line up to form two or more linear arrays, provided that the linear arrays are parallel to one another.

In the present embodiment, the inkjet device 100 sets the angle θ between the row direction d1, which is one direction in which sub-pixel formation regions SP line up, and the scanning direction ds by rotating the substrate 11 over the base 111. Alternatively, for example, the substrate 11 may be fixed with respect to the base 111, and the scanning direction ds may be set by configuring the guide shafts 113*a* and 113*b* to be freely rotatable within the plane parallel to the top surface of the base 111.

In the present embodiment, the nozzles 124N of the inkjet device 100 are moved in the scanning direction ds. Alternatively, the nozzles 124N may be displaced relative to the scanning direction ds by moving the substrate 11 in a direction opposite the scanning direction ds.

In the present embodiment, the angle θ in the application of the ink 16*a* is the angle between the scanning direction ds of the nozzle array 124 and the row direction d1, which is one direction in which pixel formation regions P line up. Alternatively, the angle θ may also be considered to be an angle between the scanning direction ds and the column direction d2, which is the other direction in which pixel formation regions P line up.

In the present embodiment, inkjet application is used for forming the light-emitting layers 16. Inkjet application may also be used for forming functional layers other than the light-emitting layers 16 (e.g., the electron transport layer 17). Application amount (layer thickness) in the forming of functional layers other than the light-emitting layer 16 may also affect pixel luminance. Thus, the risk of occurrence of linear unevenness in luminance, light-emission color, etc., in the row direction d1 may be reduced by additionally setting the angle between the row direction d1 and the scanning direction ds to be greater than 0° and less than 90° in the forming of functional layers other than the light-emitting layer 16.

In the panel 10 pertaining to the present embodiment, the row direction (d1) and the column direction (d2), which are the directions in which pixel formation regions P line up, are parallel to the long-side direction and the short-side direction of the substrate 11, respectively. Alternatively, for example, at least one of the row direction d1 and the column direction d2 may be neither parallel nor orthogonal to the long-side direction or the short-side direction of the substrate 11. In addition, the row direction d1 and the column direction d2 need not be orthogonal to one another. Note that the risk of occurrence of linear unevenness in luminance, light-emission color, etc., in both the row direction and the column direction can be reduced by setting the scanning direction ds to be inclined (by angle θ) with respect to both the row direction d1 and the column direction d2. That is, there is no substantial distinction between the row direction d1 and the column direction d2. Thus, replacing these directions with one another (using the column direction d2 as the "row direction") does not bring about any problems.

In the panel 10, each pixel formation region P includes sub-pixel formation regions SP corresponding to the three colors red, green, and blue. Alternatively, each pixel formation region P may include sub-pixel formation region(s) SP for only the color red or for the four colors red, green, blue, and yellow. Also, each sub-pixel formation regions SP need not include one sub-pixel formation region SP per color. That is, each sub-pixel formation regions SP may include two or more sub-pixel formation regions SP per color. Furthermore, sub-pixel formation regions SP in each pixel formation region P need not line up in the row direction d1, and instead, may line up in the column direction, or may be arranged positions resembling peaks of a triangle. Note that when making a modification such that each pixel formation region P includes only one sub-pixel formation region SP, all passages in the present embodiment where the term "sub-pixel formation region SP" is used can be correctly understood by replacing the term "sub-pixel formation region SP" with the term "pixel formation region P".

In the panel 10, the main body of the substrate 11 (portion excluding the TFT layer) has a rectangular shape. Alternatively, the main body of the substrate 11 may have a square shape, a polygonal shape other than a rectangular shape, a circular shape, or an elliptical shape.

In the panel 10, the first electrodes 12 serve as anodes and the second electrode 18 serves as a cathode. Alternatively, an inverse structure may be adopted in which the first electrodes 12 serve as cathodes and the second electrode 18 serves as an anode.

In the panel 10, the banks 15 may surround each of the sub-pixel formation regions SP (pixel bank scheme), or may for example surround each line of sub-pixel formation regions SP in the column direction d2 (line bank scheme). When the aforementioned line bank scheme is used, barriers (pixel definition layers) preventing cross-talk between sub-pixel formation regions SP adjacent in the column direction d2 are typically disposed. Accordingly, ink flow in the column direction d2 is limited regardless of the bank scheme applied, since in the line banks scheme, the barriers limit ink flow in the column direction d2. Thus, the manufacturing method pertaining to the present embodiment, which reduces the risk of difference in discharge amount among the nozzles 124N being reflected in the row direction d1, is useful also with the line bank scheme.

In the present embodiment, the panel 10 is a top-emission-type organic EL display panel using the active matrix scheme. Alternatively, for example, the panel 10 may be a bottom-emission-type organic EL display panel and/or use the passive matrix scheme. When making such modifications, the structure and the manufacturing method of the panel 10 are accordingly changed as necessary.

INDUSTRIAL APPLICABILITY

The organic EL display panel manufacturing method pertaining to the present invention is widely applicable as a manufacturing method of display panels usable in various electronic devices, such as televisions, personal computers, commercial displays, and portable terminals.

REFERENCE SIGNS LIST

10 Organic EL display panel
11 Substrate
12 First electrode
15 Bank
16 Light-emitting layer (functional layer)
16a Ink
18 Second electrode
124N, 824N, 924N Nozzle
Dp, Dp2 Pixel pitch
Dn Nozzle pitch
Lsp Length
N Positive integer
P Pixel formation region
SP Sub-pixel formation region
d1 Row direction
d2 Column direction
ds, dsx Scanning direction
$\alpha$, $\theta$ Angle

The invention claimed is:

1. A method for manufacturing an organic EL display panel, the method comprising:
preparing a substrate;
forming a plurality of first electrodes over the substrate;
defining, above the substrate, a plurality of pixel formation regions lining up in a row direction and a column direction to form a matrix, by forming banks over the substrate having the first electrodes formed thereon;
applying ink containing functional material to each of the pixel formation regions by causing a plurality of nozzles lining up in a straight line to discharge the ink to the pixel formation regions while displacing the nozzles relative to the substrate in a scanning direction along a main surface of the substrate;
drying the ink having been applied to form functional layers containing the functional material in the pixel formation regions; and
forming one or more layers, at least including a second electrode, at a position covering the pixel formation regions having the functional layers formed therein, wherein:
in the application of ink, an angle $\theta$ between the scanning direction and the row direction is set to more than 0° and less than 90° and each of the nozzles applies the ink across a plurality of rows of the pixel formation regions,
the pixel formation regions are defined to be located at a fixed pitch Dp in the row direction and at a fixed pitch Dp2 in the column direction,
in the application of ink, the angle $\theta$ is set to satisfy:

$$Dp \times \tan \theta \neq Dp2, \qquad \text{[Math. 1]}$$

in the application of ink, the angle $\theta$ is set to satisfy:

$$\theta = \sin^{-1}\left(\frac{N \cdot Dn \cdot \sin \alpha}{Dp}\right) \qquad \text{[Math. 2]}$$

where Dn denotes a fixed pitch between the nozzles, $\alpha$ denotes an angle between the scanning direction and the straight line, and N is a positive integer,
the pixel formation regions are defined to each include sub-pixel formation regions corresponding to colors red, green, and blue,
ink application with the nozzles is performed separately, by using different inks, for sub-pixel formation regions corresponding to the color red, sub-pixel formation regions corresponding to the color green, and sub-pixel formation regions corresponding to the color blue,
the positive integer N for angle $\theta$ defining the scanning direction in application of one of the inks with which luminance is most dependent upon application amount is larger than the positive integer N for angle $\theta$ defining the scanning direction in application of each of the other ones of the inks, and
the applying ink step includes (1) obtaining angle $\theta$ for each ink of the respective different inks of the sub-pixel formation region, where each angle $\theta$ is set using Math. 1 and Math. 2, and (2) using the obtained angles $\theta$ to discharge the respective different inks for the sub-pixel formation regions.

2. The method according to claim 1, wherein
the sub-pixel formation regions are each elongated in a direction orthogonal to the row direction, and
in the application of any of the inks, the angle $\theta$ defining the scanning direction is set to more than 0° and less than 45°.

3. The method according to claim 2, wherein
in the application of any of the inks, the angle $\theta$ defining the scanning direction is set to satisfy:

$$\theta \le \tan^{-1}\left(\frac{Lsp}{Dp}\right) \qquad \text{[Math. 3]}$$

where Lsp denotes the length of the sub-pixel formation regions in the direction orthogonal to the row direction.

4. The method according to claim 3, wherein
in the application of any of the inks, the angles A and a defining the scanning direction are set to satisfy:

$$\alpha \le 90° - \theta. \qquad \text{[Math. 4]}$$

5. The method according to claim 4, wherein
the main surface of the substrate has a rectangular shape,
the pixel formation regions are defined so that the row direction matches a direction in which long sides of the substrate extend and the column direction matches a direction in which short sides of the substrate extend, and
in the application of any of the inks, the angle θ defining the scanning direction is set to satisfy:

$$\left[\frac{H\cos\theta + W\sin\theta}{L\sin\alpha}\right] = \left[\frac{H}{L\sin\alpha}\right] \qquad \text{[Math. 5]}$$

where W denotes a length of the long sides of the substrate, H denotes a length of the short sides of the substrate, and L denotes a length of the array of the nozzles.

6. The method according to claim 1, wherein the positive integer N for angle θ defining the scanning direction in application of a green ink with which luminance is most dependent upon application amount is larger than the positive integer N for angle θ defining the scanning direction in application of blue and red inks.

\* \* \* \* \*